United States Patent
Liu et al.

(10) Patent No.: US 11,392,743 B2
(45) Date of Patent: Jul. 19, 2022

(54) MULTIPLEXER

(71) Applicant: Taiwan Semiconductor Manufacturing Company, Ltd., Hsinchu (TW)

(72) Inventors: Chi-Lin Liu, New Taipei (TW); Shang-Chih Hsieh, Yangmei (TW); Jian-Sing Li, Hsinchu (TW); Wei-Hsiang Ma, Taipei (TW); Yi-Hsun Chen, Hsinchu (TW); Cheok-Kei Lei, Macau (MO)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 28 days.

(21) Appl. No.: 16/883,524

(22) Filed: May 26, 2020

(65) Prior Publication Data

US 2020/0395938 A1 Dec. 17, 2020

Related U.S. Application Data

(60) Provisional application No. 62/861,649, filed on Jun. 14, 2019.

(51) Int. Cl.
*G06F 30/30* (2020.01)
*H01L 27/02* (2006.01)
*G06F 30/392* (2020.01)
*G06F 30/39* (2020.01)

(52) U.S. Cl.
CPC ............ *G06F 30/392* (2020.01); *G06F 30/39* (2020.01); *H01L 27/0207* (2013.01)

(58) Field of Classification Search
None
See application file for complete search history.

(56) References Cited

U.S. PATENT DOCUMENTS

| | | | | |
|---|---|---|---|---|
| 5,955,912 A | * | 9/1999 | Ko | ........................ H03K 17/693 327/410 |
| 6,211,721 B1 | | 4/2001 | Smetana | |
| 10,217,763 B2 | * | 2/2019 | Becker | ............ H01L 21/823871 |
| 10,497,702 B2 | * | 12/2019 | Zhu | ........................ H01L 23/528 |
| 11,100,273 B2 | * | 8/2021 | Peng | ..................... G06F 30/398 |
| 11,177,286 B2 | * | 11/2021 | Kim | .................. H01L 21/76224 |

FOREIGN PATENT DOCUMENTS

| | | |
|---|---|---|
| TW | 201010281 A | 3/2010 |
| TW | 201730870 A | 9/2017 |

* cited by examiner

*Primary Examiner* — Leigh M Garbowski
(74) *Attorney, Agent, or Firm* — Merchant & Gould

(57) ABSTRACT

A multiplexer circuit includes first and second fins each extending in an X-axis direction. First, second, third and fourth gates extend in a Y-axis direction perpendicular to the X-axis direction and contact the first and second fins. The first, second, third and fourth gates are configured to receive first, second, third and fourth data signals, respectively. Fifth, sixth, seventh and eighth gates extend in the Y-axis direction and contact the first and second fins, the fifth, sixth, seventh and eighth gates, and are configured to receive the first, second, third and fourth select signals, respectively. An input logic circuit is configured to provide an output at an intermediate node. A ninth gate extends in the Y-axis direction and contacts the first and second fins. An output logic circuit is configured to provide a selected one of the first, second, third and fourth data signals at an output terminal.

20 Claims, 23 Drawing Sheets

| Input | | | | | | | | Output |
|---|---|---|---|---|---|---|---|---|
| S3 | I3 | S2 | I2 | S1 | I1 | S0 | I0 | Z |
| 0 | X | 0 | X | 0 | X | 0 | X | 0 |
| 1 | 0 | 0 | X | 0 | X | 0 | X | 0 |
| 1 | 1 | 0 | X | 0 | X | 0 | X | 1 |
| 0 | X | 1 | 0 | 0 | X | 0 | X | 0 |
| 0 | X | 1 | 1 | 0 | X | 0 | X | 1 |
| 0 | X | 0 | X | 1 | 0 | 0 | X | 0 |
| 0 | X | 0 | X | 1 | 1 | 0 | X | 1 |
| 0 | X | 0 | X | 0 | X | 1 | 0 | 0 |
| 0 | X | 0 | X | 0 | X | 1 | 1 | 1 |

FIG. 3

MULTIPLEXER

CROSS-REFERENCE TO RELATED APPLICATIONS

The present application claims the benefit of U.S. Provisional Patent Application No. 62/861,649 titled "DMUX4 Circuit," filed Jun. 14, 2019, the disclosure of which is hereby incorporated by reference in its entirety.

BACKGROUND

Integrated circuits can include many standard cells with different functions. For example, standard cells can be logic gates, such as an AND gate, an OR gate, an XOR gate, a NOT gate, a NAND gate, a NOR gate, and an XNOR gate, and combinational logic circuits such as a multiplexer, a flip-flop, an adder, and a counter. Standard cells can be implemented to realize complex integrated circuit functions. When designing an integrated circuit having specific functions, standard cells are selected. Next, designers, or EDA (Electronic Design Automation) or ECAD (Electronic Computer-Aided Design) tools draw out design layouts of the integrated circuit including the selected standard cells and/or non-standard cells. The design layouts are converted to photomasks. Then, semiconductor integrated circuits can be manufactured, when patterns of various layers, defined by photography processes with the photomasks, are transferred to a substrate.

For convenience of integrated circuit design, a library including frequently used standard cells with their corresponding layouts are established. Therefore, when designing an integrated circuit, a designer can select desired standard cells from the library and places the selected standard cells in an automatic placement and routing block, such that a layout of the integrated circuit can be created.

For example, such standard cell libraries may include digital multiplexors (DMUX). DMUXs are used in a variety of applications. A multiplexer is a device that selects among several data input signals and provides a single output of a selected one or more of the inputs based on a select signal. A demultiplexer receives a single multiplexed input and splits the input into a plurality of output signals. Example applications utilizing a DMUX include memory devices and microcontrollers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a truth table for a four input multiplexer in accordance with some embodiments.

DETAILED DESCRIPTION

Figure 1:
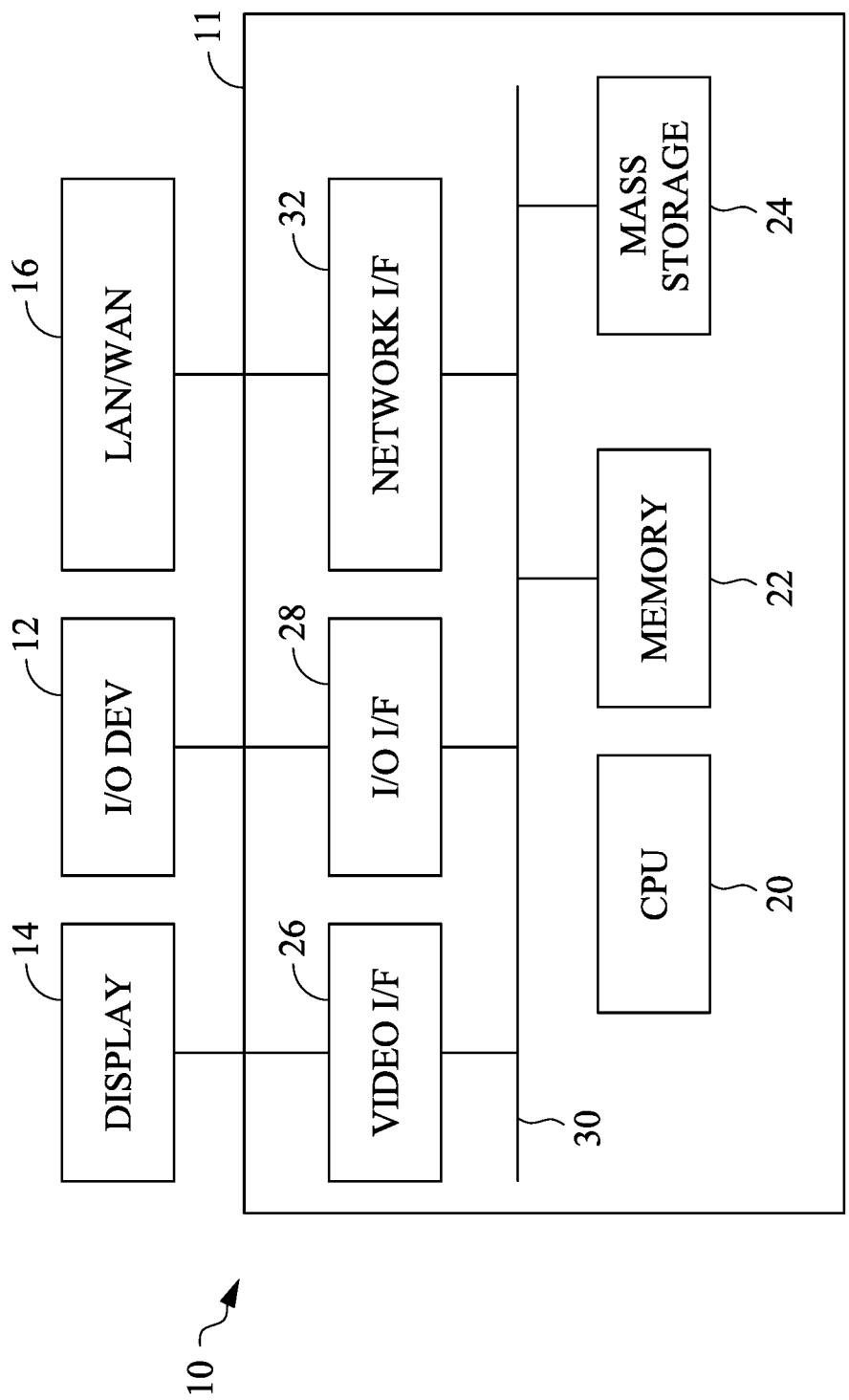
FIG. 1 is a block diagram illustrating an example of a processing system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Electronic Design Automation (EDA) tools and methods facilitate the design, partition, and placement of microelectronic integrated circuits on a semiconductor substrate. This process typically includes turning a behavioral description of the circuit into a functional description, which is then decomposed into logic functions and mapped into cells using a standard cell library. Once mapped, a synthesis is performed to turn the structural design into a physical layout, a clock tree is built to synchronize the structural elements, and the design is optimized post layout.

FIG. 1 is a block diagram illustrating an example of a processing system 10 in accordance with some embodiments disclosed herein. The processing system 10 may be used to implement an EDA system in accordance with various processes discussed herein. The processing system 10 includes a processing unit 11, such as a desktop computer, a workstation, a laptop computer, a dedicated unit customized for a particular application, a smart phone or tablet, etc. The processing system 10 may be equipped with a display 14 and one or more input/output devices 12, such as a mouse, a keyboard, touchscreen, printer, etc. The processing unit 11 also includes a central processing unit (CPU) 20, memory 22, a mass storage device 24, a video adapter 26, and an I/O interface 28 connected to a bus 30.

The bus 30 may be one or more of any type of several bus architectures including a memory bus or memory controller, a peripheral bus, or video bus. The CPU 20 may comprise any type of electronic data processor, and the memory 22 may comprise any type of system memory, such as static random access memory (SRAM), dynamic random access memory (DRAM), or read-only memory (ROM).

The mass storage device 24 may comprise any type of storage device configured to store data, programs, and other information and to make the data, programs, and other information accessible via the bus 30. The mass storage device 24 may comprise, for example, one or more of a hard disk drive, a magnetic disk drive, an optical disk drive, flash memory, or the like.

The term computer readable media as used herein may include computer storage media such as the system memory and storage devices mentioned above. Computer storage media may include volatile and nonvolatile, removable and non-removable media implemented in any method or technology for storage of information, such as computer readable instructions, data structures, or program modules. The memory 22 and mass storage device 24 are computer storage media examples (e.g., memory storage). The mass storage device may further store a library of standard cells, such as standard cells disclosed herein.

Computer storage media may include RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by the processing system 10. Any such computer storage media may be part of the processing system 10. Computer storage media does not include a carrier wave or other propagated or modulated data signal.

Communication media may be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media.

The video adapter 26 and the I/O interface 28 provide interfaces to couple external input and output devices to the processing unit 11. As illustrated in FIG. 1, examples of input and output devices include the display 14 coupled to the video adapter 26 and the I/O device 12, such as a mouse, keyboard, printer, and the like, coupled to the I/O interface 28. Other devices may be coupled to the processing unit 11, and additional or fewer interface cards may be utilized. For example, a serial interface card (not shown) may be used to provide a serial interface for a printer. The processing unit 11 also may include a network interface 32 that may be a wired link to a local area network (LAN) or a wide area network (WAN) 16 and/or a wireless link.

Embodiments of the processing system 10 may include other components. For example, the processing system 10 may include power supplies, cables, a motherboard, removable storage media, cases, and the like. These other components, although not shown, are considered part of the processing system 10.

In some examples, software code is executed by the CPU 20 to analyze a user design to create a physical integrated circuit layout. The software code may be accessed by the CPU 20 via the bus 30 from the memory 22, mass storage device 24, or the like, or remotely through the network interface 32. Further, in some examples, the physical integrated circuit layout is created based on a functional integrated circuit design, which may be received though the I/O interface 28 and/or stored in the memory 22 or the mass storage device 24 in accordance with various methods and processes implemented by the software code.

A standard cell can include an entire device, such as a transistor, diode, capacitor, resistor, or inductor, or can include a group of several devices arranged to achieve some particular function, such as an inverter, a flip-flop, a memory cell, or multiplexer, among others. In addition to making functional design easier to conceptualize, the use of standard cells can reduce verification time for design rule checking (DRC) of the layout features within the IC, because a standard cell that is repeated throughout the layout can be checked a single time in DRC rather than each instantiation being checked individually. Based on the received functional circuit description, the processing system 10 is configured to select standard cells from the cell library.

Figure 2:
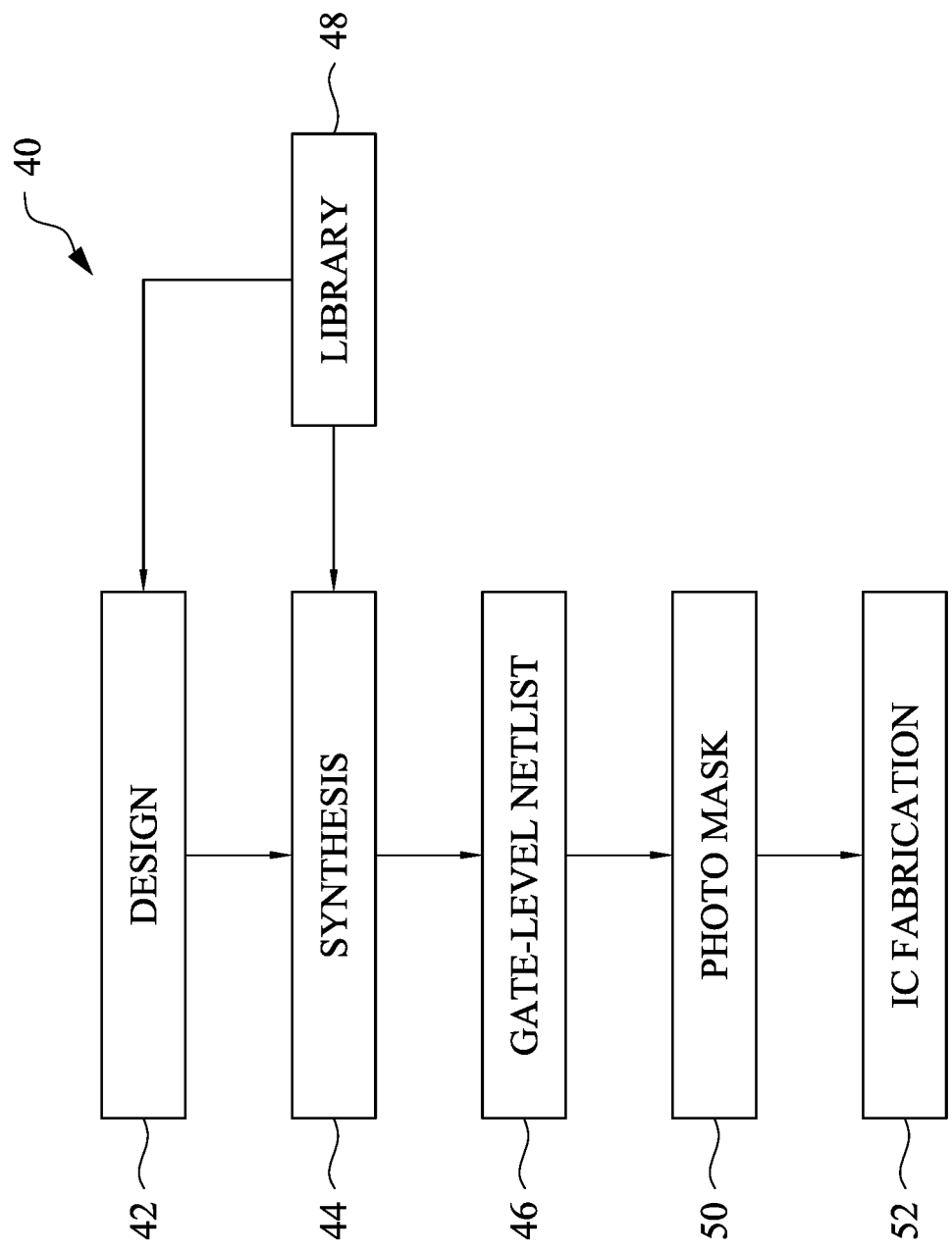
FIG. 2 is a flow diagram illustrating an integrated circuit design and fabrication process in accordance with some embodiments.

FIG. 2 generally illustrates an example integrated circuit design and fabrication process 40 that may be implemented by the processing system 10 for generating a physical layout from a user supplied behavioral/functional design. The user design 42 specifies the desired behavior or function of the circuit based upon various signals or stimuli applied to the inputs of the overall design, and may be written in a suitable programming language. The design 42 may be uploaded into the processing unit 11 (see FIG. 1) through the I/O interface 28 by a user. Alternatively, the design 42 may be uploaded and/or saved on the memory 22 or mass storage device 24, or the design 42 may be uploaded through the network interface 32 from a remote user.

A synthesis 44 is performed on the design, in which the behavior and/or functions desired from the design 42 are transformed to a functionally equivalent logic gate-level circuit description by matching the design to standard cells, such as from one or more cell libraries 48. The cell library 48 contains a listing of pre-designed components, or functional cells, each of which may perform a predetermined function. The cells are stored in the cell library 48 as information comprising internal circuit elements, the various connections to these circuit elements, a pre-designed physical layout pattern, dopant implants, wells, etc. Additionally, the stored cell may also comprise a shape of the cell, terminal positions for external connections, delay characteristics, power consumption, etc. The synthesis 44 results in a functionally equivalent logic gate-level circuit description, such as a gate-level netlist 46. The cell library 48 may be stored, for example, in one or more databases contained in the mass storage device 24. Based on the gate-level netlist 46, a photolithographic mask 50 may be generated, which is used to fabricate the integrated circuit 52.

A digital multiplexer (sometimes referred to herein as a DMUX) is a device that selects among several data input signals and provides a single output of a selected one or more of the inputs based on a select signal. A de-multiplexer receives a single multiplexed input and splits the input into a plurality of output signals. Thus, for example, a DMUX4 refers to a digital multiplexer that receives four data input signals (I0-I3) and select signals (S0-S3) and outputs a single signal (Z) based on the data and select input signals. FIG. 3 illustrates an example truth table for a DMUX4, showing the data input signals I0-I3, select signals S0-S3 and outputs signal Z.

Example applications utilizing a DMUX include integrated circuit devices, memory devices and microcontrollers. Standard cells, such as standard cells stored in the cell library 48 shown in FIG. 2 may include various DMUX circuits, and such DMUX cells are often a very highly used for certain integrated circuit devices.

Aspects of this disclosure relate to DMUX circuits and layout embodiments for reducing area-cost and improving overall performance for systems utilizing DMUX circuits. In some examples, embodiments employ DMUX design innovations to reduce transistor counts. In some disclosed examples, combinational logic and layout structures may reduce the area utilized by the DMUX circuit reduced nearly 8%. Additionally, power consumption and speed may be improved. For instance, disclosed embodiments provide DMUX circuits using various combinations of logic circuits implemented without transmission gates, which are typically used in known DMUX circuits.

Some disclosed DMUX cells include logic circuits with transistors formed using a fin field effect transistor (FinFET) architecture. For example, a polysilicon or other conductive structure can be connected to a semiconductor fin that extends above an isolation material. The polysilicon structure functions as the gate of the FinFET transistor such that a voltage applied to the polysilicon structure determines the flow of electrons between source/drain (S/D) contacts connected to the fin on opposite sides of the polysilicon structure. A threshold voltage of the FinFET transistor is the minimum voltage such that the transistor is considered to be turned "on" such that an appreciable current can flow between the S/D contacts. The number of polysilicon structures in contact with a fin along its length that are used in forming a DMUX cell can be considered to be the "pitch," often termed the "contacted poly pitch" or Cpp, of the cell along one dimension and is at least partially determinative of the density of the cell.

Figure 4:
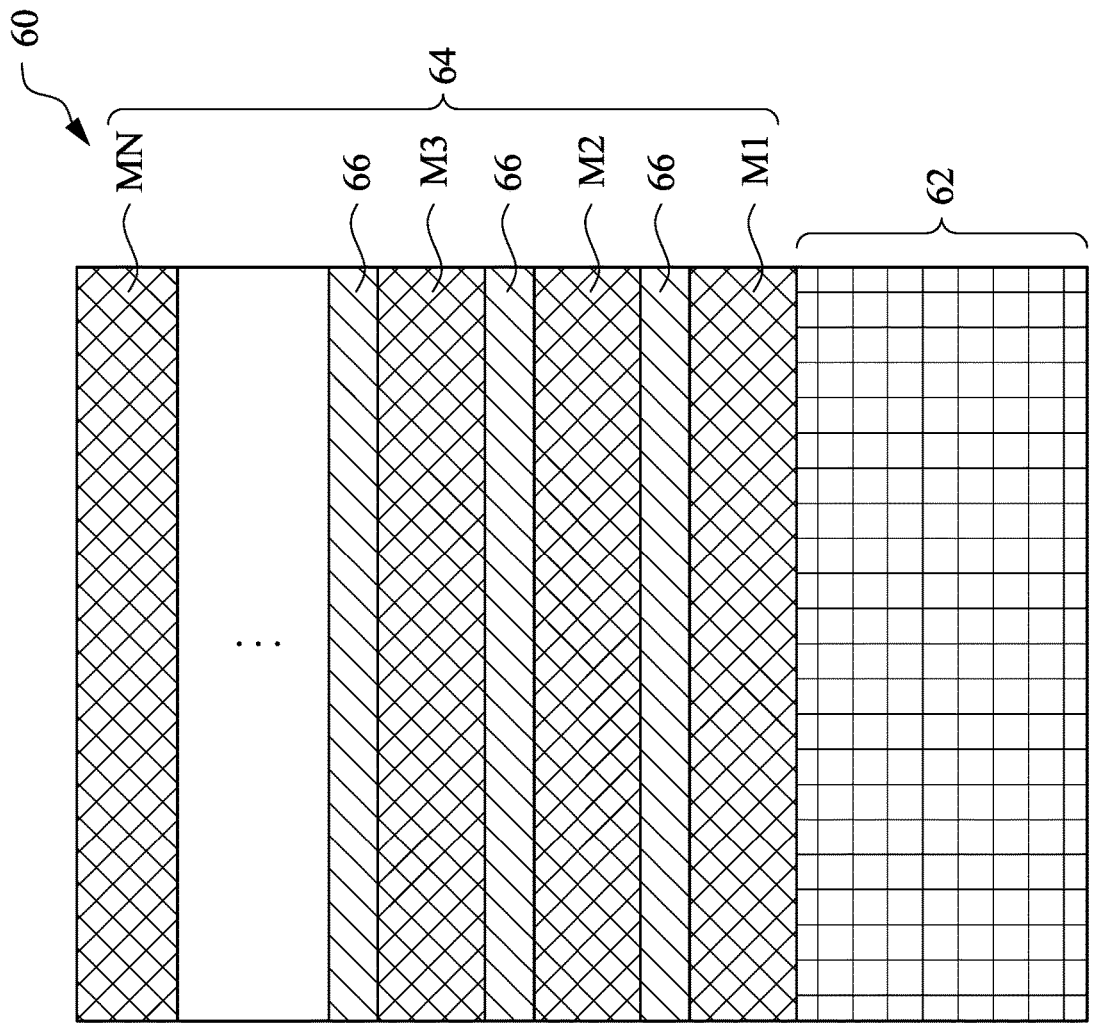
FIG. 4 is a block diagram illustrating a cross-section of an example semiconductor structure in accordance with some embodiments.

FIG. 4 is a block diagram illustrating a cross-section of an example semiconductor structure which may be used for implementing DMUX devices disclosed herein. The structure 60 is shown in the X-axis and Z-axis directions while the Y-axis direction is orthogonal to the plane of the cross-section illustrated in FIG. 4. The structure 60 includes a base layer 62 and an interconnect layer 64.

Generally, the base layer 62 includes a semiconductor substrate that, in turn, includes polysilicon regions (e.g. also termed "poly" throughout this disclosure), diffusion regions, semiconductor wells (e.g., N-wells, P-wells, deep N-wells, deep P-wells), etc., wherein semiconductor devices (e.g., transistors, diodes, etc.) are formed. An interconnect layer 64 includes N (e.g., an integer number of) conductive layers (e.g., metal layers M1 to MN) used for interconnecting devices within layers in interconnect layer 64 and for forming electrical connections to external devices, etc. The interconnect layer 64 generally includes vias, inter-level dielectric materials, passivation layers, bonding pads, packaging resources, etc. Each metal (e.g., conductive) layer M in the interconnect layer 64 is commonly called metal one, metal two, metal three (M1, M2, M3, etc) layers, etc. Between the various metal layers M are dielectric materials (e.g., high-K, low-K material, etc.) 66 used to insulate the metal layers M. The base layer 62 and interconnect layer 64 are often called a front-end structure and a backend structure, respectively, because they are the respective "front end of line" (FEOL) and "back end of line" (BEOL) in the semiconductor fabrication process. In some embodiments, DMUX devices are built using the base layer 62 and one or more of the metal layers M.

Figure 5A:
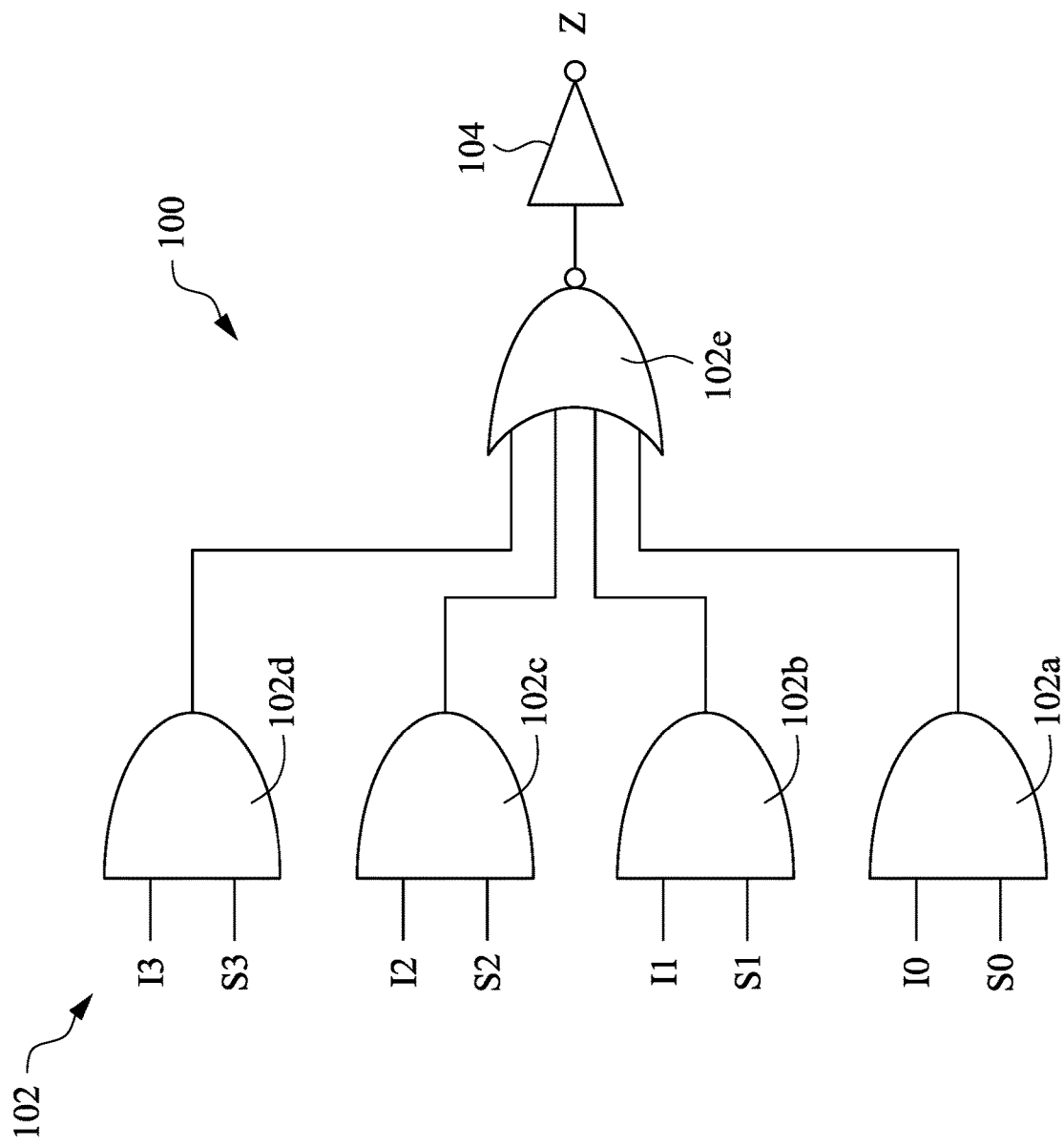
FIG. 5A is a logic diagram and FIG. 5B is a circuit diagram illustrating an example digital multiplexer (DMUX) in accordance with some embodiments.
Figure 5B:
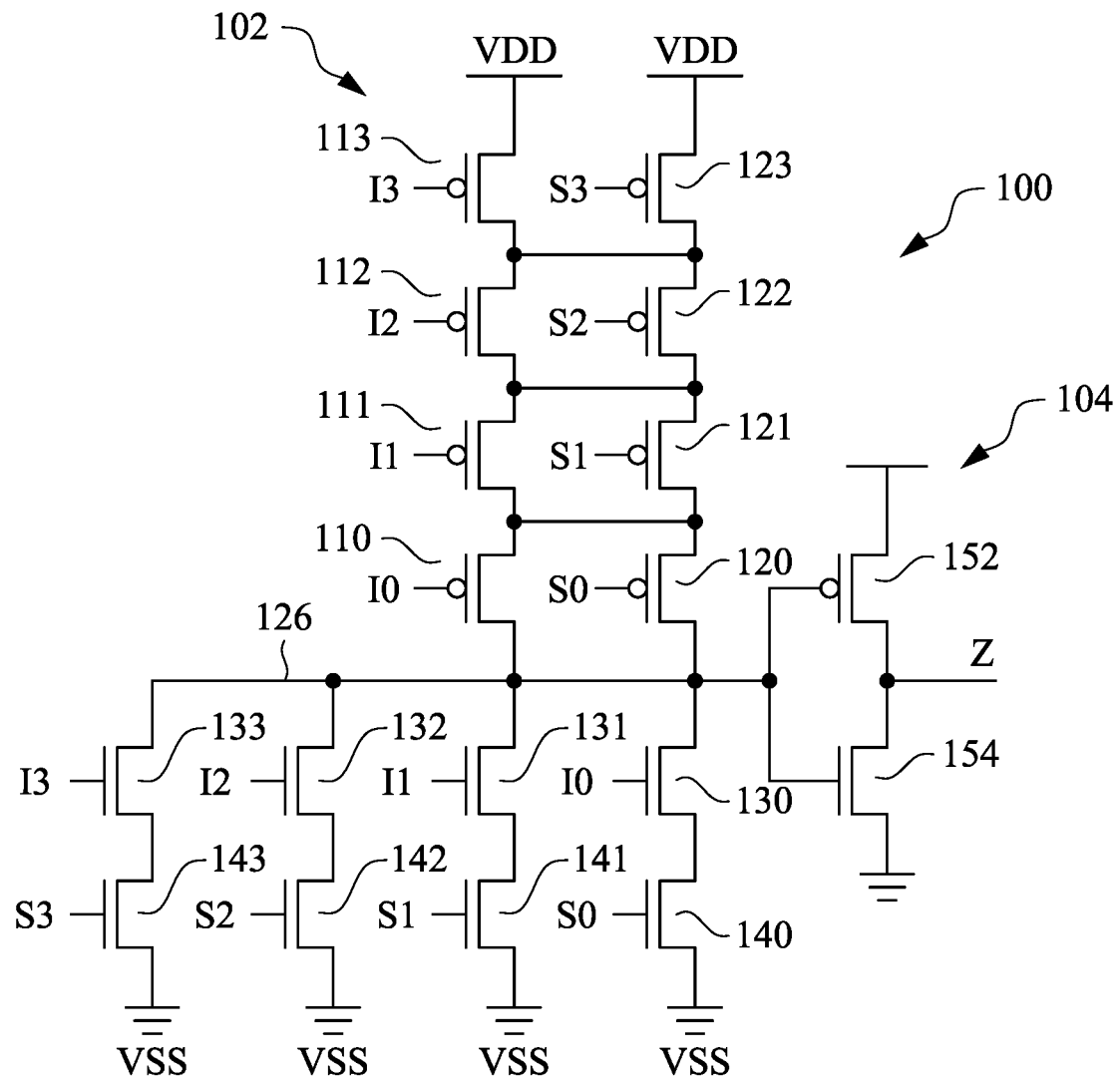
Figure 6:
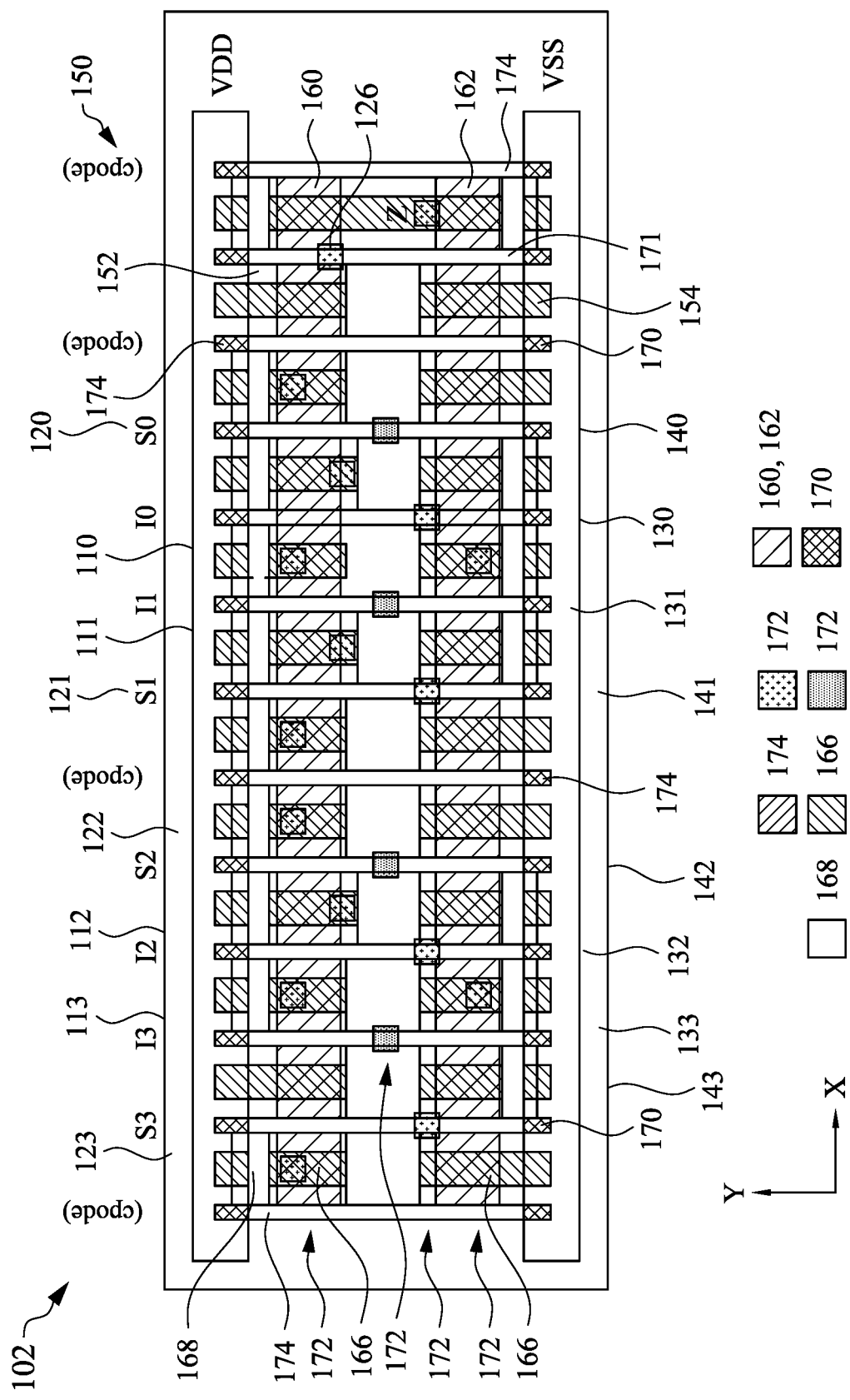
FIG. 6 is a layout diagram illustrating an example standard cell layout for the DMUX shown in FIG. 5B in accordance with some embodiments.

FIGS. 5A and 5B illustrate a DMUX4 circuit 100, and FIG. 6 illustrates an example standard cell layout diagram for the DMUX4 circuit 100 in accordance with some embodiments. The DMUX4 circuit 100 includes an eight-input AND-OR (AO2222) logic circuit 102 and an inverter 104 that together are implemented by 18 transistors. In general, the AO2222 circuit 102 is configured to receive the data signals I0-I3 and the signals S0-S3 and is thus referred to herein as a multiplexer input logic circuit. The AO2222 circuit 102 is further configured to output an inverse of the selected one of the data signals I0-I3 in response to the select signals S0-S3. The inverter circuit 104 is configured to receive the output of the AO2222 circuit 102 and provide the output signal Z based on the selected data signal, and is thus referred to herein as a multiplexer output logic circuit.

More particularly, AO2222 circuit 102 includes four 2-input AND gates 102a-102d that respectively receive the I0/S0-I3/S3 inputs. The outputs of the AND gates 102a-102d are received by a NOR gate 102e. An inverter 104 receives the output of the NOR gate 102e to provide the output signal Z. FIG. 5B illustrates one example of the DMUX circuit 100, where the AO2222 circuit 102 includes PMOS transistors 110, 111, 112, and 113 that each have gate terminals coupled to receive the I0, I1, I2, and I3 inputs, respectively. PMOS transistors 120, 121, 122, and 123 each have gate terminals coupled to receive the S0, S1, S2, and S3 inputs, respectively. The PMOS transistors 110-113 are connected in series between a VDD power rail and an intermediate node 126, as are the PMOS transistors 120-123. More particularly, the transistors 113 and 123 have source terminals coupled to the VDD rail, and drain terminals connected to source terminals of the adjacent transistors 112 and 122, respectively. Similarly, the transistors 112 and 122 have drain terminals connected to respective source terminals of the transistors 111 and 121, which have drain terminals connected to respective source terminals of the transistors 110 and 120, which further have drain terminals coupled to the intermediate node 126. Still further, the drain terminals of the transistors 111, 112 and 113 are connected to the respective drain terminals of the transistors 121, 122 and 123.

The AO2222 circuit 102 further includes NMOS transistors 130, 131, 132, and 133 that each have gate terminals coupled to receive the I0, I1, I2, and I3 inputs, respectively. NMOS transistors 140, 141, 142, and 143 each have gate terminals coupled to receive the S0, S1, S2, and S3 inputs, respectively. The NMOS transistors 130-133 each have drain terminals coupled to the intermediate node 126 and source terminals coupled to drain terminals of the NMOS transistors 140-143, respectively. Source terminals of each of the NMOS transistors 140-143 are connected to a VSS power rail.

The intermediate node 126 is connected to an input of the inverter 104, which includes a PMOS transistor 152 and NMOS transistor 154 connected between the VDD and VSS rails. The inverter 104 provides the output signal Z of the DMUX4 100.

Thus, if any of the select signals S0-S1 AND its corresponding data signal I0-I3 are high, the associated PMOS transistor pair(s) is deactivated and the intermediate node 126 is cut off from the VDD rail. Further, the associated NMOS transistor pair(s) is activated to connect the intermediate node 126 to the VSS rail, pulling the intermediate node 126 low. The low signal at the intermediate node 126 is inverted to high by the inverter 104.

The example layout diagram shown in FIG. 6 includes first and second fins 160, 162 extending in the X-axis direction. Metal lines 166, which may be in one or more metal layers, e.g. M1 extend between the VDD and VSS rails and the fins 160 and 162 to connect the source or drain terminals of the transistors to the VDD or VSS rails as shown in FIG. 5B. For transistors where source or drain terminals are not connected to the VDD or VSS terminals, the metal lines 166 may be cut or disconnected from the VDD or VSS rails. For instance, metal lines 166 connect the source terminals of the transistors 113 and 123 to the VDD rail, and the source terminals of the transistors 140-143 to the VSS rail. Metal cuts 168 separate the source terminals of the transistors 110-112 and 120-122 from the VDD rail, and the source terminals of the transistors 131-133 from the VSS rail.

Active gate structures 170 extend in the Y-axis direction and are connected to corresponding data signals I0-I3 and select signals S0-S3. In the illustrated example, the gate structures may include active polysilicon structures ("poly gates"). It should be understood that in the present disclosure, the X-axis and Y-axis are shown and described as being transverse or substantially perpendicular to one another. However, the X-axis and Y-axis may not actually be perfectly perpendicular to each other due to design, manufacturing, measurement errors/margins caused by unperfected manufacturing and measurement conditions. Such a description should be recognizable to one of ordinary skill in the art.

Each of the poly gates 170 contacts both the first and second fins 160, 162. Further, as shown in FIG. 6, each of the poly gates 170 receives a corresponding one of the data signals I0-I3 or one of the select signals S0-S3. In other words, each poly gate 170 receives one input signal. Accordingly, in the embodiment illustrated in FIG. 6, there are eight poly gates 170 to receive the four data signals I0-I3 and the four select signals S0-S3. Further, a ninth gate or poly gate 171 extends in the Y-axis direction and contacts the first and second fins 160 and 162. The ninth poly gate 171 is connected to the intermediate node 126 and forms the transistors 152 and 154 of the inverter 104.

In the embodiment shown, the fins 160 and 162 have a longer dimension (e.g. a length) along the X-axis direction as shown in FIG. 6, and are separated from each other in the Y-axis direction. The poly gates 170 and the metal lines 166 have a longer dimension (e.g. a length) along the Y-axis direction and are separated from each other in the X-axis direction.

Via contacts 172 interconnect various terminals of the illustrated transistors as shown in FIG. 5B through additional metal contacts (not shown in FIG. 6) that are disposed in other metal layers M1-MN of the device. In order to avoid leakage between neighboring devices (cells), the standard cell includes the inactive gate structures formed on edges of the active regions, e.g. the fins 160, 162. Such inactive, or "dummy" polysilicon gate structures 174 also extend in the Y-axis direction, and function to separate cells from one another, and also to separate portions of one cell from another. In some examples, the inactive poly structures are referred to as continuous poly on oxide definition edge (CPODE) patterns. That is, the inactive polysilicon structures are not electrically connected as gates for MOS devices but are instead "dummy" structures, having no function in the circuit. The inactive poly structures further cover and protect the ends of the fins in the cells during processing, providing additional reliability during processing.

Figure 7A:
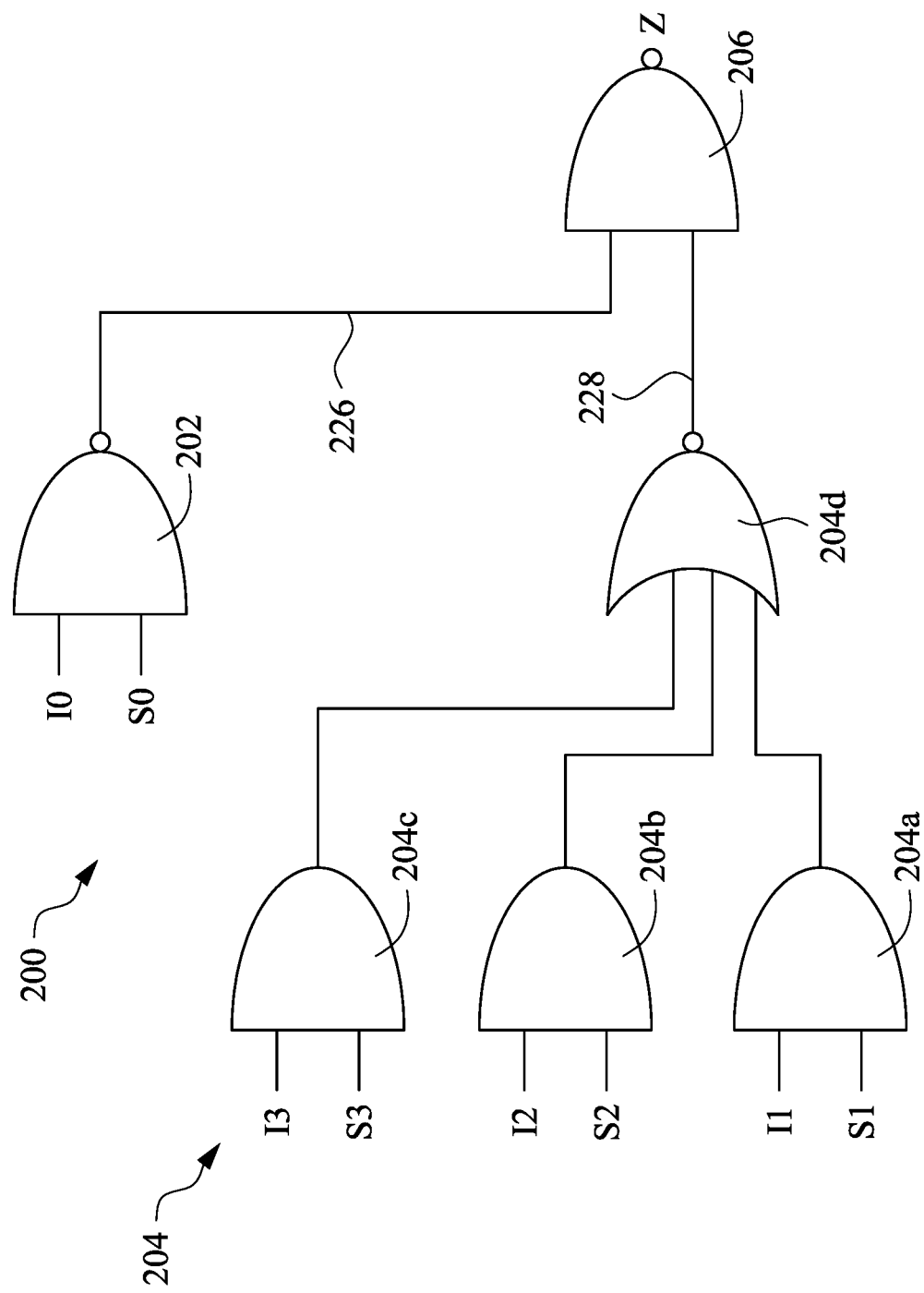
FIG. 7A is a logic diagram and FIG. 7B is a circuit diagram illustrating another example DMUX in accordance with some embodiments.
Figure 7B:
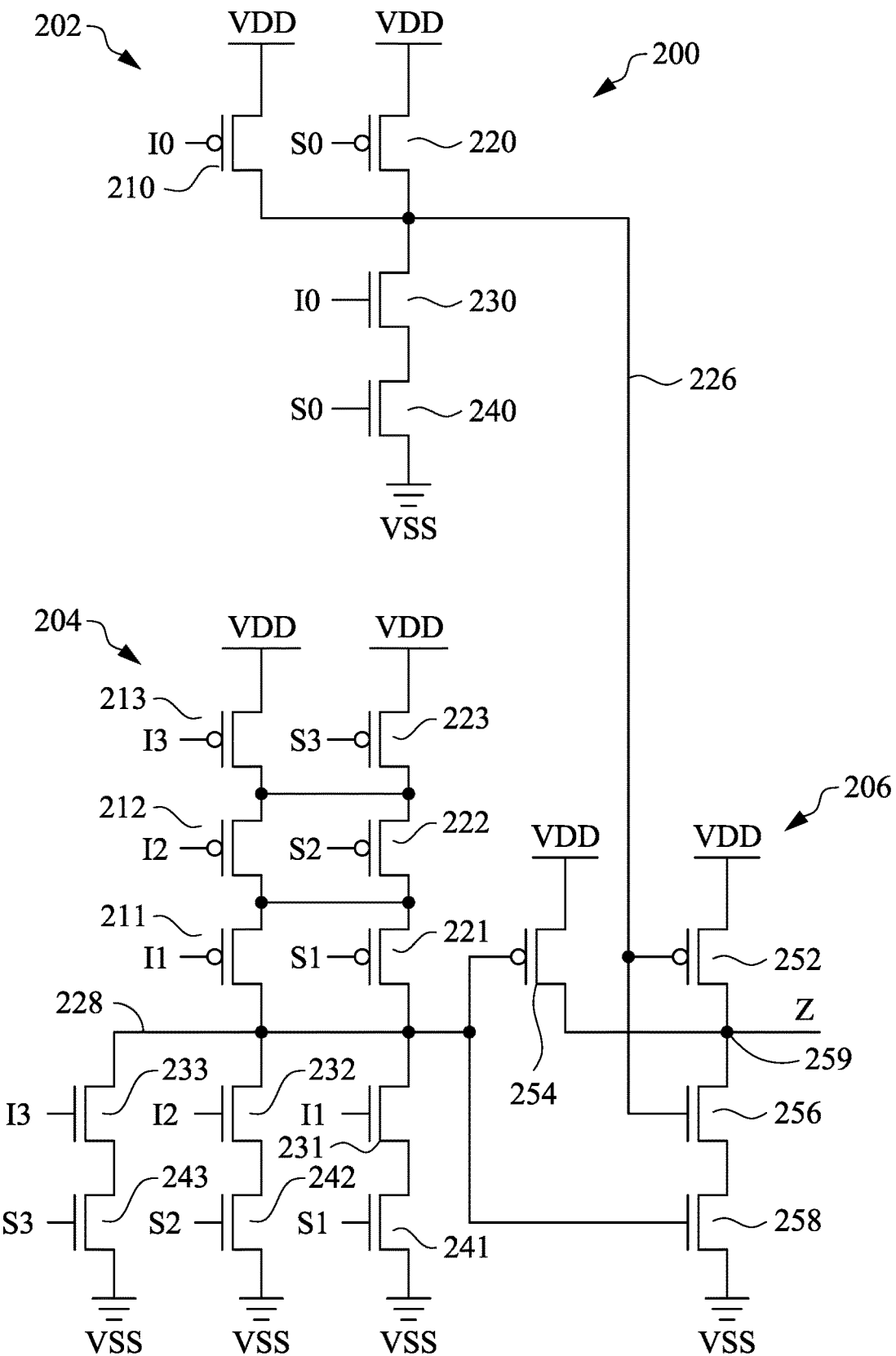
Figure 8:
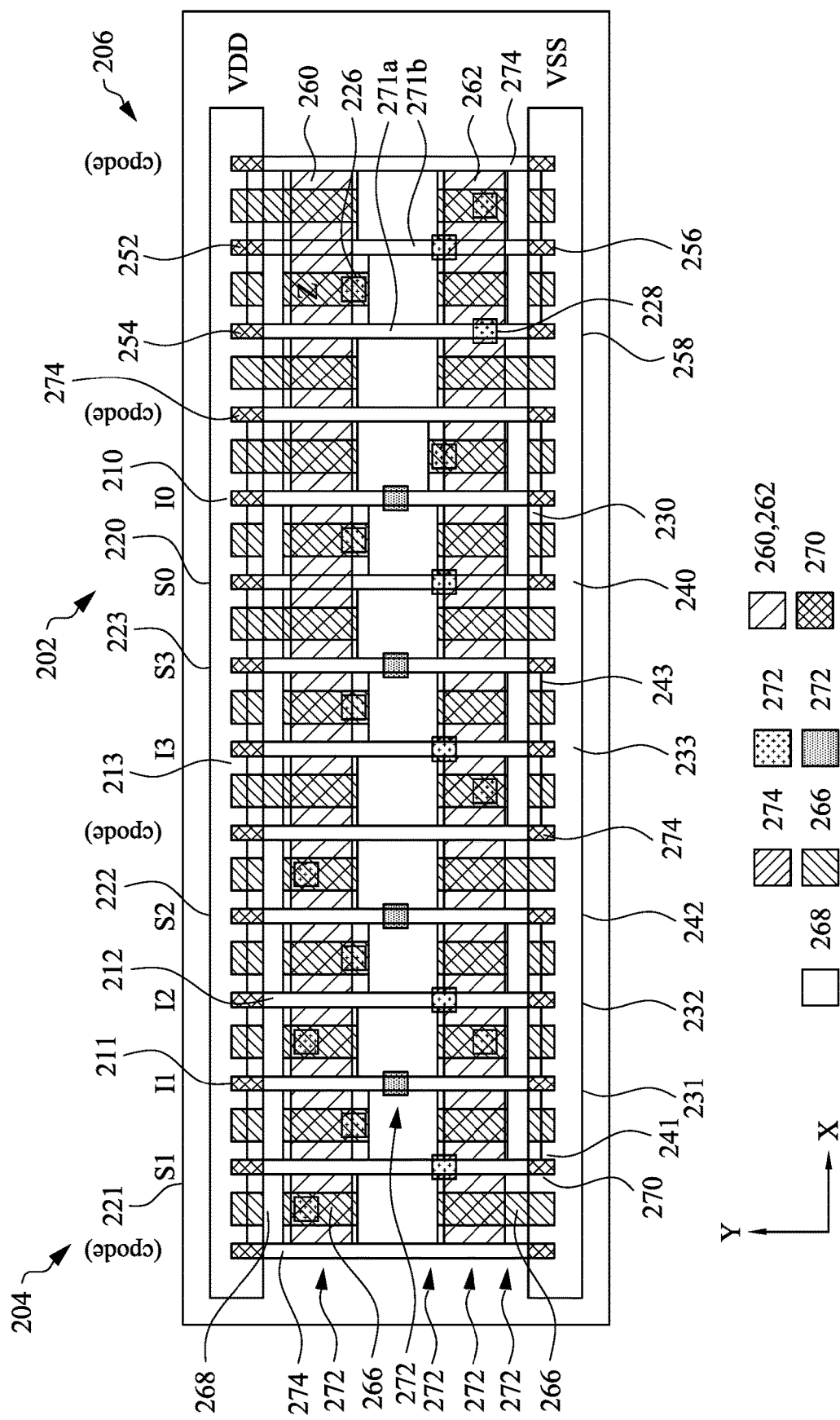
FIG. 8 is a layout diagram illustrating an example standard cell layout for the DMUX shown in FIG. 7B in accordance with some embodiments.

FIGS. 7A and 7B illustrate a DMUX4 circuit 200, and FIG. 8 illustrates an example standard cell layout diagram for the DMUX4 circuit 200 in accordance with some embodiments. The DMUX4 circuit 200 utilizes six-input AND-OR-INVERT (AOI222) logic with two-input NAND (ND2) logic that are implemented with 20 transistors in the illustrated example. In general, the DMUX4 circuit 200 includes an input logic circuit that has a first ND2 circuit 202 and an AOI222 circuit 204. The first ND2 circuit 202 is configured to receive the data signal I0 and the select signal S0 and to provide an output at a first intermediate node 226. The AOI222 circuit 204 includes three AND gates 204a-204c configured to respectively receive the data signals I1-I3 and respectively receive the select signals S1-S3. The outputs of the AND gates 204a-204c are received by a NOR gate 204d, which is configured to provide an output at a second intermediate node 228. An output logic circuit includes a second ND2 circuit 206 that has inputs connected to the first and second intermediate nodes to receive the outputs of the first ND2 circuit 202 and the AOI222 circuit 204, and provide the selected data signal Z.

More particularly, as shown in FIG. 7B the first ND2 circuit 202 includes a PMOS transistor 210 that has a gate terminal coupled to receive the I0 data signal. A PMOS transistor 220 has a gate terminal coupled to receive the S0 select signal. The PMOS transistor 210 and the PMOS transistor 220 are both have source terminals coupled to the VDD rail, and drain terminals connected the intermediate node 226. NMOS transistors 230 and 240 have gate terminals coupled to receive the I0 and S0 inputs, respectively. The NMOS transistor 230 has a drain terminal coupled to the intermediate node 226 and a source terminal coupled to a drain terminals of the NMOS transistor 240. A source terminal of the NMOS transistors 240 is connected to the VSS power rail.

The AOI222 circuit 204 includes PMOS transistors 211, 212, and 213 that each have gate terminals coupled to receive the I1, I2, and I3 inputs, respectively. PMOS transistors 221, 222, and 223 each have gate terminals coupled to receive the S1, S2, and S3 inputs, respectively. The PMOS transistors 211-213 are connected in series between the VDD power rail and a second intermediate node 228, as are the PMOS transistors 221-223. More particularly, the transistors 213 and 223 have source terminals coupled to the VDD rail, and drain terminals connected to source terminals of the adjacent transistors 212 and 222, respectively. Similarly, the transistors 212 and 222 have drain terminals connected to respective source terminals of the transistors 211 and 221, which have drain terminals coupled to the second intermediate node 228. Still further, the drain terminals of the transistors 211, 212 and 213 are connected to the respective drain terminals of the transistors 221, 222 and 223.

The AOI222 circuit 204 further includes NMOS transistors 231, 232, and 233 that each have gate terminals coupled to receive the I1, I2, and I3 inputs, respectively. NMOS transistors 241, 242, and 243 each have gate terminals coupled to receive the S1, S2, and S3 inputs, respectively. The PMOS transistors 211-213 each have drain terminals coupled to the second intermediate node 228 and source terminals coupled to drain terminals of the NMOS transistors 241-243, respectively. Source terminals of each of the NMOS transistors 241-243 are connected to the VSS power rail.

The second ND2 circuit 206 includes a PMOS transistor 252 that has a gate terminal coupled to the first intermediate node 226, and PMOS transistor 254 has a gate terminal coupled to the second intermediate node 228. The PMOS transistor 254 and the NMOS transistor 256 both have source terminals coupled to the VDD rail, and drain terminals connected to an output terminal 259 that provides the output signal Z. NMOS transistors 256 and 258 have gate terminals coupled to the first and second intermediate nodes, respectively. The NMOS transistor 256 has a drain terminal coupled to the output terminal 259 and a source terminal coupled to a drain terminals of the NMOS transistor 258. A source terminal of the NMOS transistor 258 is connected to the VSS power rail.

FIG. 8 illustrates an example standard cell layout for the DMUX4 circuit 200 that includes first and second fins 260, 262 extending in the X-axis direction. Metal lines 266, which may be in one or more metal layers, e.g. M1 extend between the VDD and VDD rails and the fins 260 and 262 to connect the source or drain terminals of the transistors to the VDD or VSS rails as shown in FIG. 7B. For transistors where source or drain terminals are not connected to the VDD or VSS terminals, the metal lines 266 may be cut or disconnected from the VDD or VSS rails. For instance, metal lines 266 connect the source terminals of the transistors 210, 213, 220, 223, 252 and 254 to the VDD rail, and the source terminals of the transistors 240-243 and 258 to the VSS rail. Metal cuts 268 separate the source terminals of the transistors 211, 212, 221 and 222 from the VDD rail, and the source terminals of the transistors 230-233 and 256 from the VSS rail.

Gates, such as poly gates 270 extend in the Y-axis direction and are connected to corresponding data signals I0-I3 and select signals S0-S3. Each of the poly gates 270 contacts both the first and second fins 260, 262. In the embodiment illustrated in FIG. 8, eight of the poly gates 270 to receive the four data signals I0-I3 and the four select signals S0-S3. Additional poly gates 271a and 271b are connected to the fins 260 and 262 to form the transistors of the second ND2 circuit 206.

Via contacts 272 interconnect various terminals of the illustrated transistors as shown in FIG. 7B through additional metal contacts that are disposed in other metal layers M1-MN of the device. Inactive polysilicon structures are formed on edges the fins 260, 262 to separate cells from one another. Additional polysilicon structures 274 separate portions of one cell from another, such as the second ND2 circuit 206 from the first ND2 circuit 202.

Figure 9A:
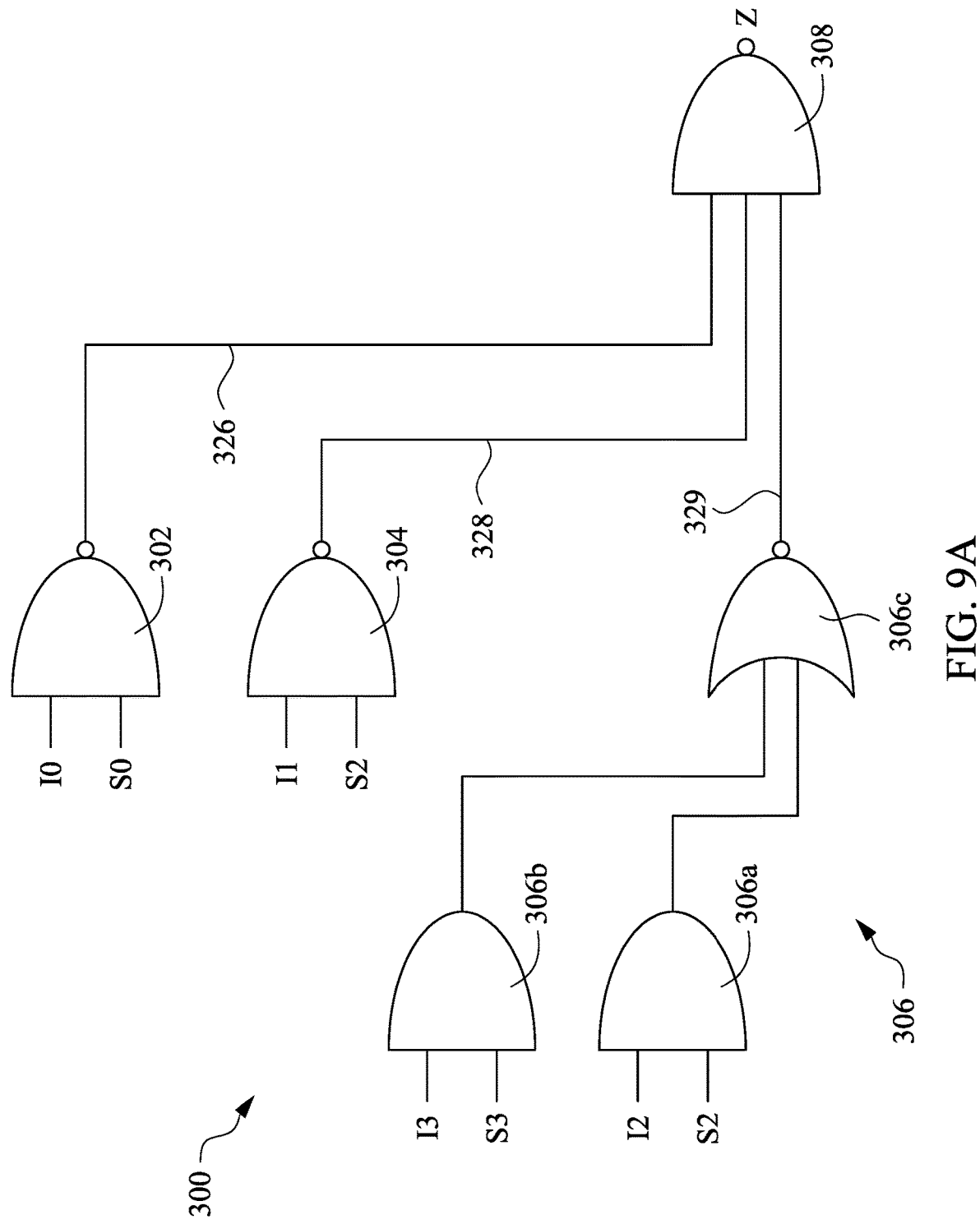
FIG. 9A is a logic diagram and FIG. 9B is a circuit diagram illustrating a further example DMUX in accordance with some embodiments.
Figure 9B:
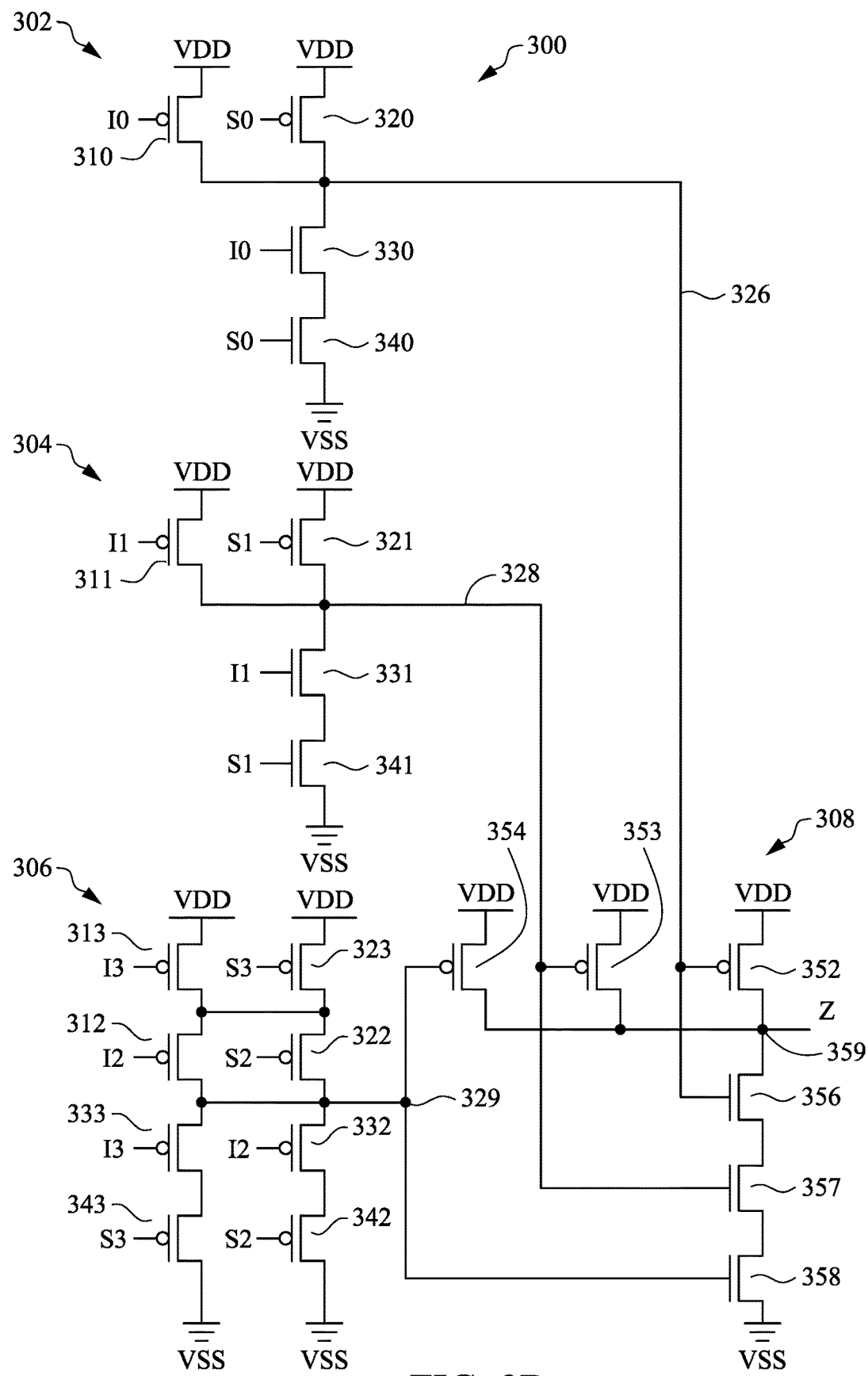
Figure 10:
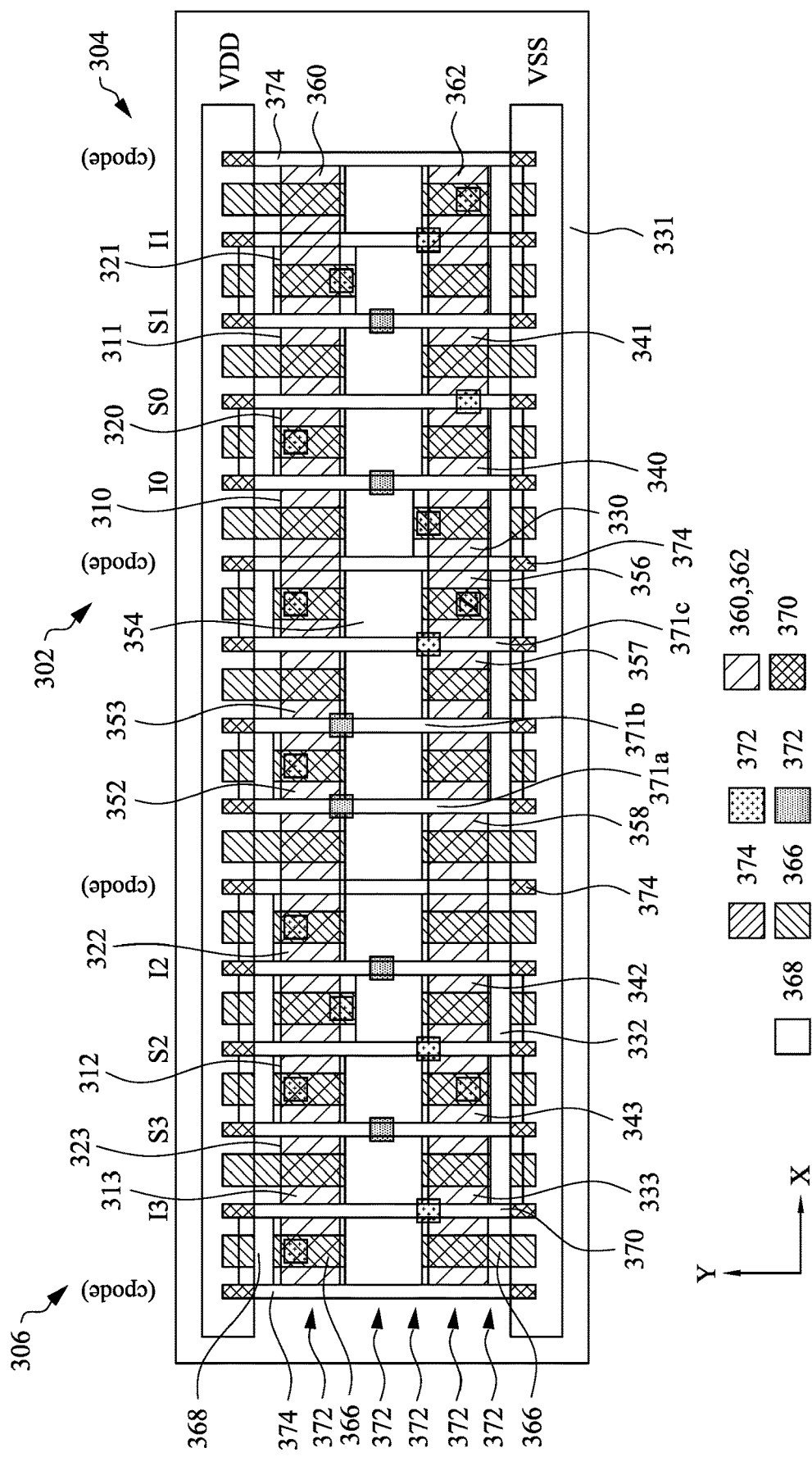
FIG. 10 is a layout diagram illustrating an example standard cell layout for the DMUX shown in FIG. 9B in accordance with some embodiments.

FIGS. 9A and 9B illustrate another embodiment of a DMUX4 circuit 300, and FIG. 10 illustrates an example standard cell layout for the DMUX4 circuit 300. The DMUX4 circuit 300 includes an input logic circuit with a first ND2 circuit 302 configured to receive the data signal I0 and the select signal S0, and provide an output at a first intermediate node 326. A second ND2 circuit 304 is configured to receive the data signal I1 and the select signal S1 and provide an output at a second intermediate node 328. A 4-input AND-OR-INVERT (AOI22) circuit 306 includes AND gates 306a and 306b configured to respectively receive the data signals I2 and I3 and to respectively receive the select signals S2 and S3. A NOR gate 306c receives the outputs of the AND gates 306a and 306b, and provides an output at a third intermediate node 329. A logic output circuit has a 3-input NAND (ND3) circuit 308 with inputs connected to the first, second and third intermediate nodes 326, 328 and 329 and is configured to output the selected one of the first, second, third and fourth data signals I0-I3.

More particularly, as shown in FIG. 9B the first ND2 circuit 302 includes a PMOS transistor 310 that has a gate terminal coupled to receive the I0 data signal. A PMOS transistor 320 has a gate terminal coupled to receive the S0 select signal. The PMOS transistor 310 and the PMOS transistor 320 both have source terminals coupled to the VDD rail, and drain terminals connected to the first intermediate node 326. NMOS transistors 330 and 340 have gate terminals coupled to receive the I0 and S0 inputs, respectively. The NMOS transistor 330 has a drain terminal coupled to the first intermediate node 326 and a source terminal coupled to a drain terminal of the NMOS transistor 340. A source terminal of the NMOS transistor 340 is connected to the VSS power rail.

The second ND2 circuit 304 includes a PMOS transistor 310 that has a gate terminal coupled to receive the I1 data signal. A PMOS transistor 321 has a gate terminal coupled to receive the S1 select signal. The PMOS transistor 311 and the PMOS transistor 321 both have source terminals coupled to the VDD rail, and drain terminals connected to the second intermediate node 328. NMOS transistors 331 and 341 have gate terminals coupled to receive the I1 and S1 inputs, respectively. The NMOS transistor 331 has a drain terminal coupled to the second intermediate node 328 and a source terminal coupled to a drain terminal of the NMOS transistor 341. A source terminal of the NMOS transistor 341 is connected to the VSS power rail.

The AOI22 circuit 306 includes PMOS transistors 312, and 313 that each have gate terminals coupled to receive the I2, and I3 inputs, respectively. PMOS transistors 322, and 323 each have gate terminals coupled to receive the S2, and S3 inputs, respectively. The PMOS transistors 312 and 313 are connected in series between the VDD power rail and a third intermediate node 329, as are the PMOS transistors 322 and 323. More particularly, the transistors 313 and 323 have source terminals coupled to the VDD rail, and drain terminals connected to source terminals of the adjacent transistors 312 and 322, respectively, which have drain terminals coupled to the third intermediate node 329. Still further, the drain terminals of the transistors 312 and 313 are connected to the respective drain terminals of the transistors 322 and 323.

The AOI22 circuit 306 further includes NMOS transistors 332, and 333 that each have gate terminals coupled to receive the I2 and I3 inputs, respectively. NMOS transistors 342 and 343 each have gate terminals coupled to receive the S2 and S3 inputs, respectively. The PMOS transistors 312 and 313 each have drain terminals coupled to the third intermediate node 329 and source terminals coupled to drain terminals of the NMOS transistors 342 and 343, respectively. Source terminals of each of the NMOS transistors 341 and 343 are connected to the VSS power rail.

The ND3 circuit 308 includes a PMOS transistor 352 that has a gate terminal coupled to the first intermediate node 326, a PMOS transistor 353 has a gate terminal coupled to the second intermediate node 328, and a PMOS transistor 354 has a gate terminal coupled to the third intermediate node 329. The PMOS transistors 352, 353 and 354 each have a source terminal coupled to the VDD rail, and a drain terminal connected to an output terminal 359 that provides the output signal Z. NMOS transistors 356, 357, and 358 have gate terminals coupled to the first, second and third intermediate nodes 326, 328 and 329, respectively. The NMOS transistor 356 has a drain terminal coupled to the output terminal 359 and a source terminal coupled to a drain terminal of the NMOS transistor 357. A source terminal of the NMOS transistor 357 is coupled to a drain terminal of the NMOS transistor 358, which has a source terminal connected to the VSS power rail.

FIG. 10 illustrates an example standard cell layout for the DMUX4 circuit 300 that includes first and second fins 360, 362 extending in the X-axis direction. Metal lines 366, which may be in one or more metal layers, e.g. M1 extend between the VDD and VSS rails and the fins 360 and 362 to connect the source or drain terminals of the transistors to the VDD or VSS rails as shown in FIG. 9B. For transistors where source or drain terminals are not connected to the VDD or VSS terminals, the metal lines 366 may be cut or disconnected from the VDD or VSS rails. For instance, metal lines 366 connect the source terminals of the transistors 310, 311, 313, 320, 321, 323, and 352-354 to the VDD rail, and the source terminals of the transistors 340-343, and 358 to the VSS rail. Metal cuts 368 separate the source terminals of the transistors not connected to the VDD or VSS rails, such as transistors 312, 322, 330, 331-333, 356 and 357 from the VSS rail.

Gates, such as poly gates 370 extend in the Y-axis direction and are connected to corresponding data signals I0-I3 and select signals S0-S3. Each of the poly gates 370 contacts both the first and second fins 360, 362. In the embodiment illustrated in FIG. 10, eight of the poly gates 370 to receive the four data signals I0-I3 and the four select signals S0-S3. Additional poly gates 371a, 371b, 371c are connected to the fins 360 and 362 to form the transistors of the ND3 circuit 308.

Via contacts 372 interconnect various terminals of the illustrated transistors as shown in FIG. 10 through additional metal contacts that may be disposed in other metal layers M1-MN of the device. Inactive polysilicon structures 374 are formed on edges the fins 360, 362 to separate cells from one another. Additional inactive polysilicon structures 374 separate portions of one cell from another, such as the second ND2 circuit 304 from the first ND2 circuit 302.

Figure 11A:
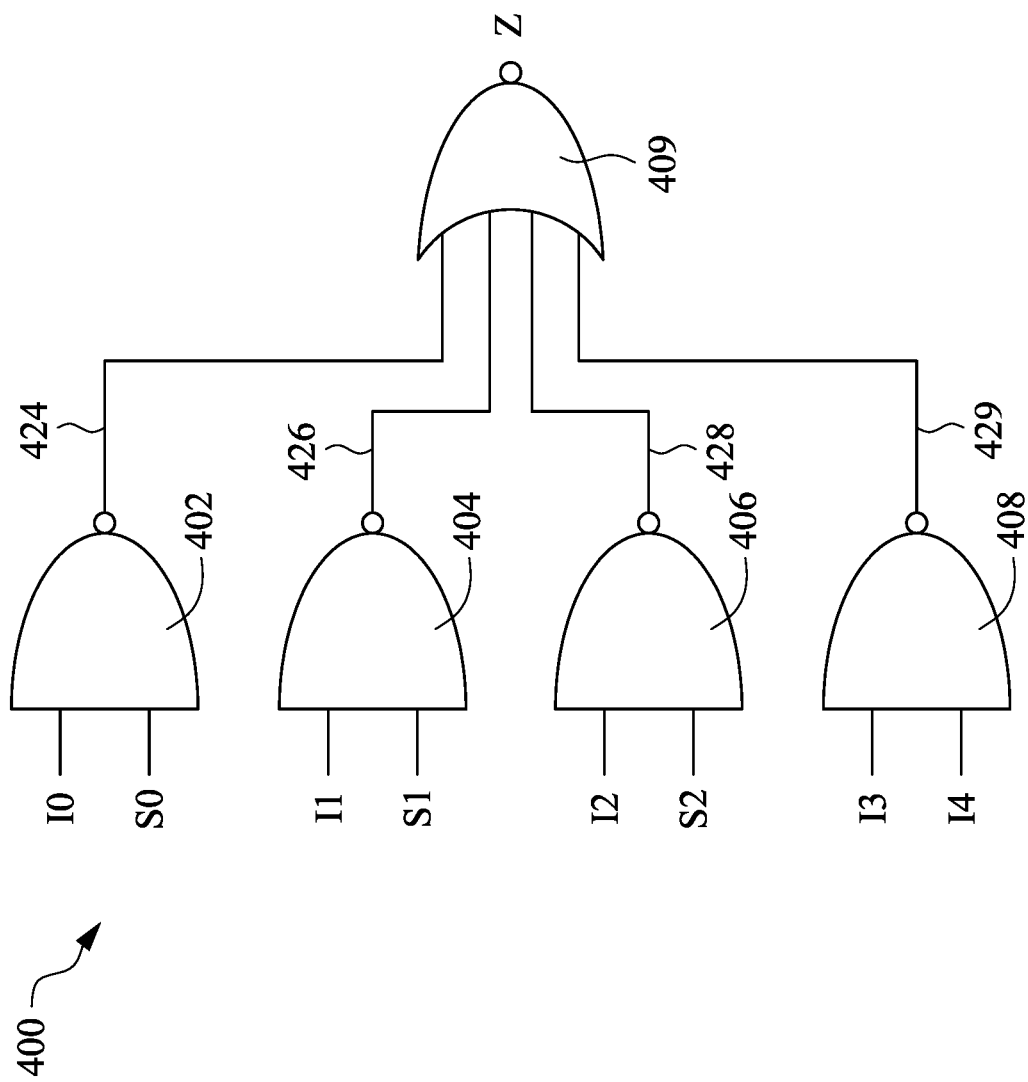
FIG. 11A is a logic diagram and FIG. 11B is a circuit diagram illustrating yet another example DMUX in accordance with some embodiments.
Figure 11B:
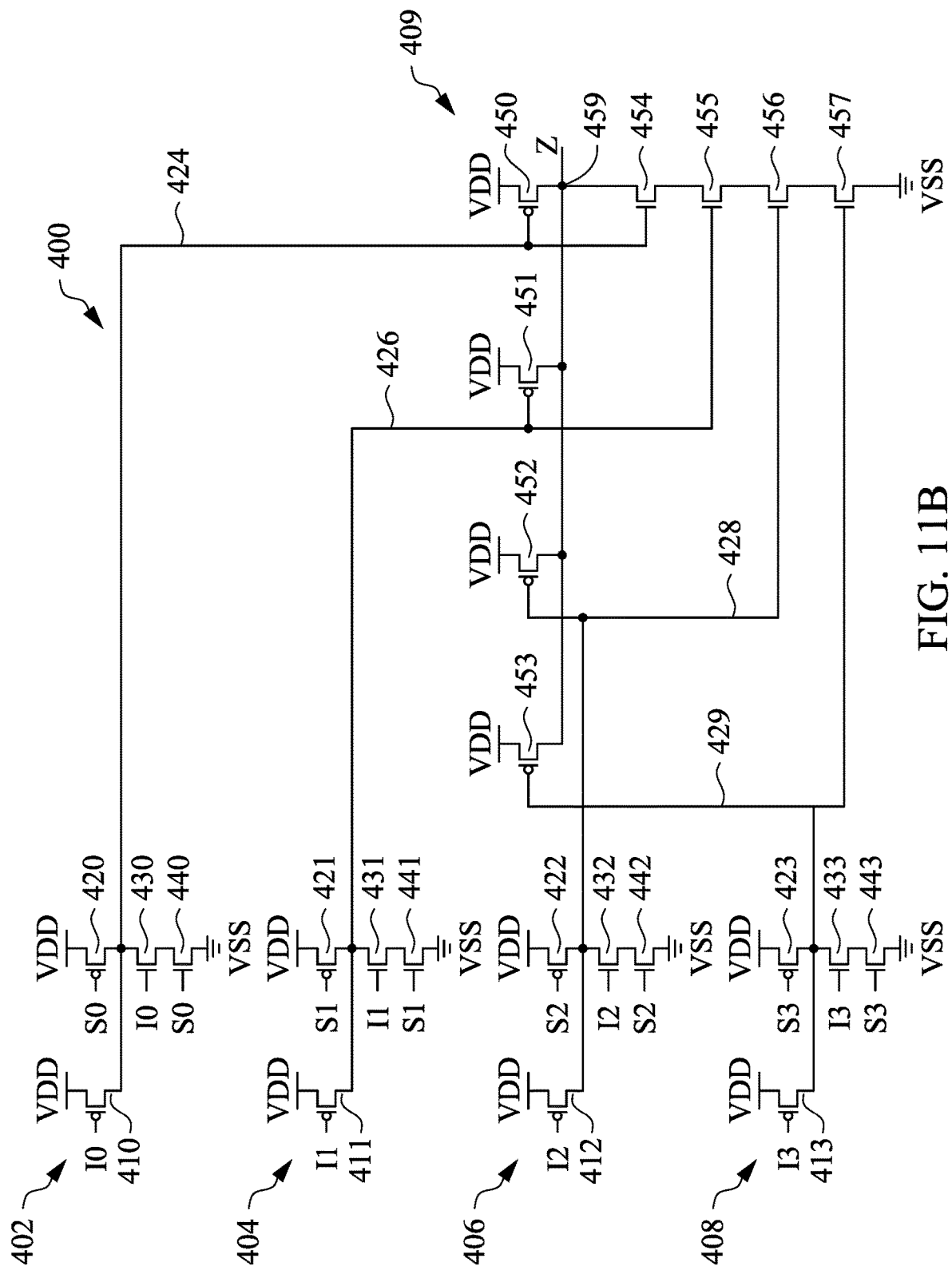

FIGS. 11A and 11B illustrate another embodiment of a DMUX4 circuit 400 that includes 24 transistors forming ND2 circuits and a four-input NAND (ND4) circuit. As shown in FIGS. 11A and 11B, the DMUX4 circuit 400 includes an input circuit with four ND2 gates 402, 404, 406 and 408. The first ND2 circuit 402 is configured to receive the I0 data signal and the S0 select signal, and to provide an output at a first intermediate node 424. The second ND2 circuit 404 is configured to receive the I1 data signal and the S1 select signal, and to provide an output at a second intermediate node 426. The third ND2 circuit 406 is configured to receive the I2 data signal and the S2 select signal, and to provide an output at a third intermediate node 428. The fourth ND2 circuit 408 is configured to receive the I3 data signal and the S3 select signal, and to provide an output at a fourth intermediate node 429. An output logic circuit has an ND4 circuit 409 with input terminals connected to the first, second, third and fourth intermediate nodes 424, 426, 428, 429 and configured to provide a selected one of the first, second, third and fourth data signal I0-I3.

More particularly, as shown in FIG. 11B the first ND2 circuit 402 includes a PMOS transistor 410 that has a gate terminal coupled to receive the I0 data signal. A PMOS transistor 420 has a gate terminal coupled to receive the S0 select signal. The PMOS transistor 410 and the PMOS transistor 420 both have source terminals coupled to the VDD rail, and drain terminals connected to the first intermediate node 426. NMOS transistors 430 and 440 have gate terminals coupled to receive the I0 and S0 inputs, respectively. The NMOS transistor 430 has a drain terminal coupled to the first intermediate node 424 and a source terminal coupled to a drain terminal of the NMOS transistor 440. A source terminal of the NMOS transistor 440 is connected to the VSS power rail.

The second ND2 circuit 404 includes a PMOS transistor 410 that has a gate terminal coupled to receive the I1 data signal. A PMOS transistor 421 has a gate terminal coupled to receive the S1 select signal. The PMOS transistor 411 and the PMOS transistor 421 both have source terminals coupled to the VDD rail, and drain terminals connected to the second intermediate node 428. NMOS transistors 431 and 441 have gate terminals coupled to receive the I1 and S1 inputs, respectively. The NMOS transistor 431 has a drain terminal coupled to the second intermediate node 426 and a source terminal coupled to a drain terminal of the NMOS transistor 441. A source terminal of the NMOS transistor 441 is connected to the VSS power rail.

The third ND2 circuit 406 includes a PMOS transistor 412 that has a gate terminal coupled to receive the I2 data signal. A PMOS transistor 422 has a gate terminal coupled to receive the S2 select signal. The PMOS transistor 412 and the PMOS transistor 422 both have source terminals coupled to the VDD rail, and drain terminals connected to the third intermediate node 428. NMOS transistors 432 and 442 have gate terminals coupled to receive the I2 and S2 inputs, respectively. The NMOS transistor 432 has a drain terminal coupled to the third intermediate node 428 and a source terminal coupled to a drain terminal of the NMOS transistor 442. A source terminal of the NMOS transistor 442 is connected to the VSS power rail.

The fourth ND2 circuit 408 includes a PMOS transistor 413 that has a gate terminal coupled to receive the I3 data signal. A PMOS transistor 423 has a gate terminal coupled to receive the S3 select signal. The PMOS transistor 413 and the PMOS transistor 423 both have source terminals coupled to the VDD rail, and drain terminals connected to the fourth intermediate node 429. NMOS transistors 433 and 443 have gate terminals coupled to receive the I3 and S3 inputs, respectively. The NMOS transistor 433 has a drain terminal coupled to the fourth intermediate node 429 and a source terminal coupled to a drain terminal of the NMOS transistor 443. A source terminal of the NMOS transistor 443 is connected to the VSS power rail.

The ND4 circuit 409 includes a PMOS transistor 450 that has a gate terminal coupled to the first intermediate node 424, a PMOS transistor 451 with a gate terminal coupled to the second intermediate node 426, a PMOS transistor 452 with a gate terminal coupled to the third intermediate node 428, and a PMOS transistor 453 with a gate terminal coupled to the fourth intermediate node 429. The PMOS transistors 450, 451, 452 and 453 each have a source terminal coupled to the VDD rail, and a drain terminal connected to the output terminal 459 that provides the output signal Z. NMOS transistors 454, 455, 456 and 457 have gate terminals coupled to the first, second, third and fourth intermediate nodes 424, 426, 428 and 429, respectively. The NMOS transistor 454 has a drain terminal coupled to the output terminal 459 and a source terminal coupled to a drain terminal of the NMOS transistor 455. A source terminal of the NMOS transistor 456 is coupled to a drain terminal of the NMOS transistor 457, which has a source terminal connected to the VSS power rail.

FIG. 11 illustrates an example standard cell layout for the DMUX4 circuit 400 that includes first and second fins 460, 462 extending in the X-axis direction. Metal lines 466, which may be in one or more metal layers, e.g. M1 extend between the VDD and VDD rails and the fins 460 and 462 to connect the source or drain terminals of the transistors to the VDD or VSS rails as shown in FIG. 11. For transistors where source or drain terminals are not connected to the VDD or VSS terminals, the metal lines 466 may be cut or disconnected from the VDD or VSS rails. For instance, metal lines 466 connect the source terminals of the transistors 410-413, 420-423, and 450-453 to the VDD rail, and the source terminals of the transistors 440-443, and 462 to the VSS rail. Metal cuts 468 separate the source terminals of the transistors not connected to the VDD or VSS rails, such as transistors 430-433, and 454-456 from the VSS rail.

Gates, such as poly gates 470 extend in the Y-axis direction and are connected to corresponding data signals I0-I3 and select signals S0-S3. Each of the poly gates 470 contacts both the first and second fins 460, 462. In the embodiment illustrated in FIG. 8, eight of the poly gates 470 to receive the four data signals I0-I3 and the four select signals S0-S3. Additional poly gates 471a, 471b, 471c, 471d are connected to the fins 460 and 462 to form the transistors of the ND4 circuit 409.

Figure 12:
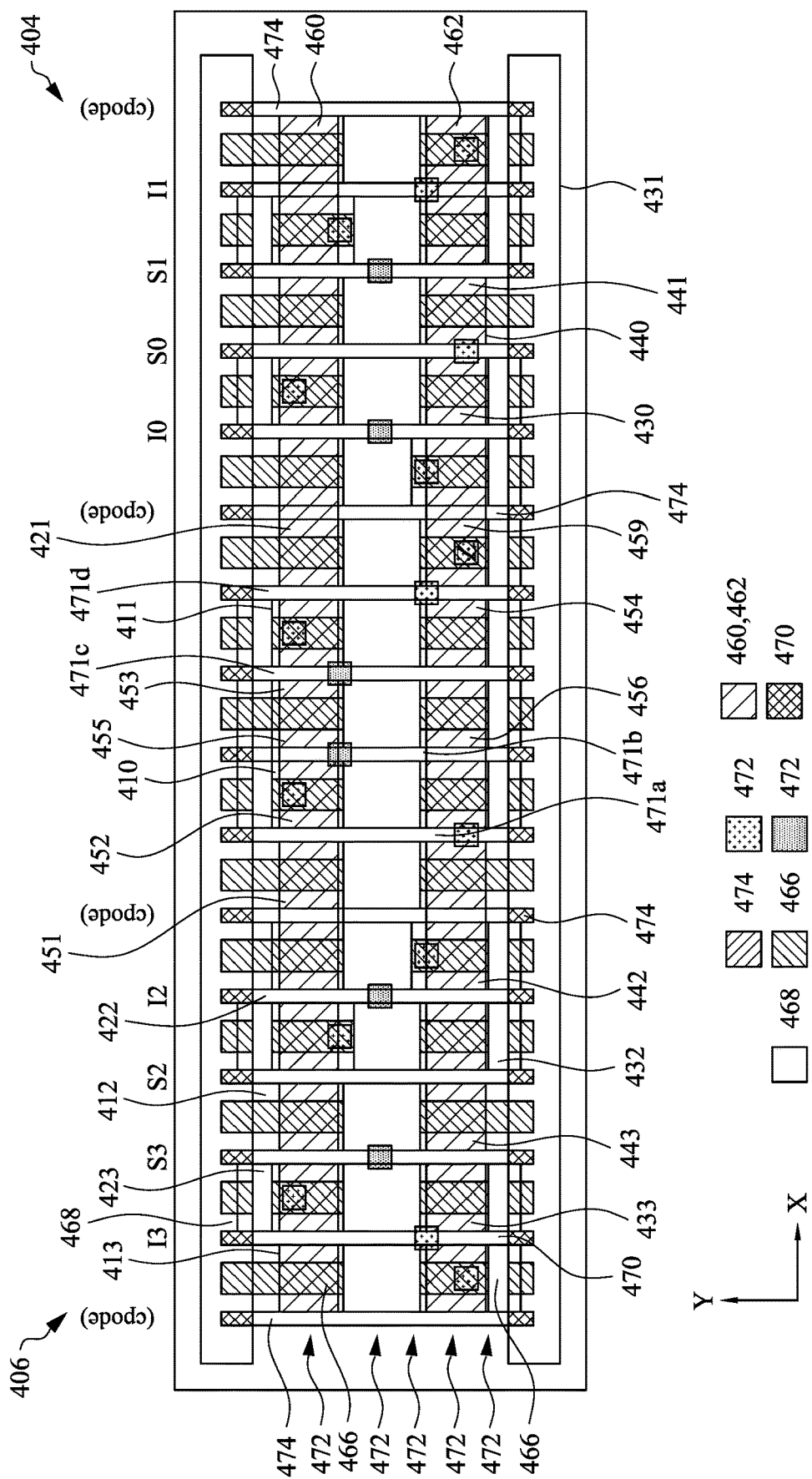
FIG. 12 is a layout diagram illustrating an example standard cell layout for the DMUX shown in FIG. 11B in accordance with some embodiments.

Via contacts 472 interconnect various terminals of the illustrated transistors as shown in FIG. 12 through additional metal contacts that may be disposed in other metal layers M1-MN of the device. Inactive polysilicon structures are formed on edges the fins 460, 462 to separate cells from one another. Additional polysilicon structures 474 separate portions of one cell from another, such as the second ND2 circuit 404 from the first ND2 circuit 402.

Figure 13A:
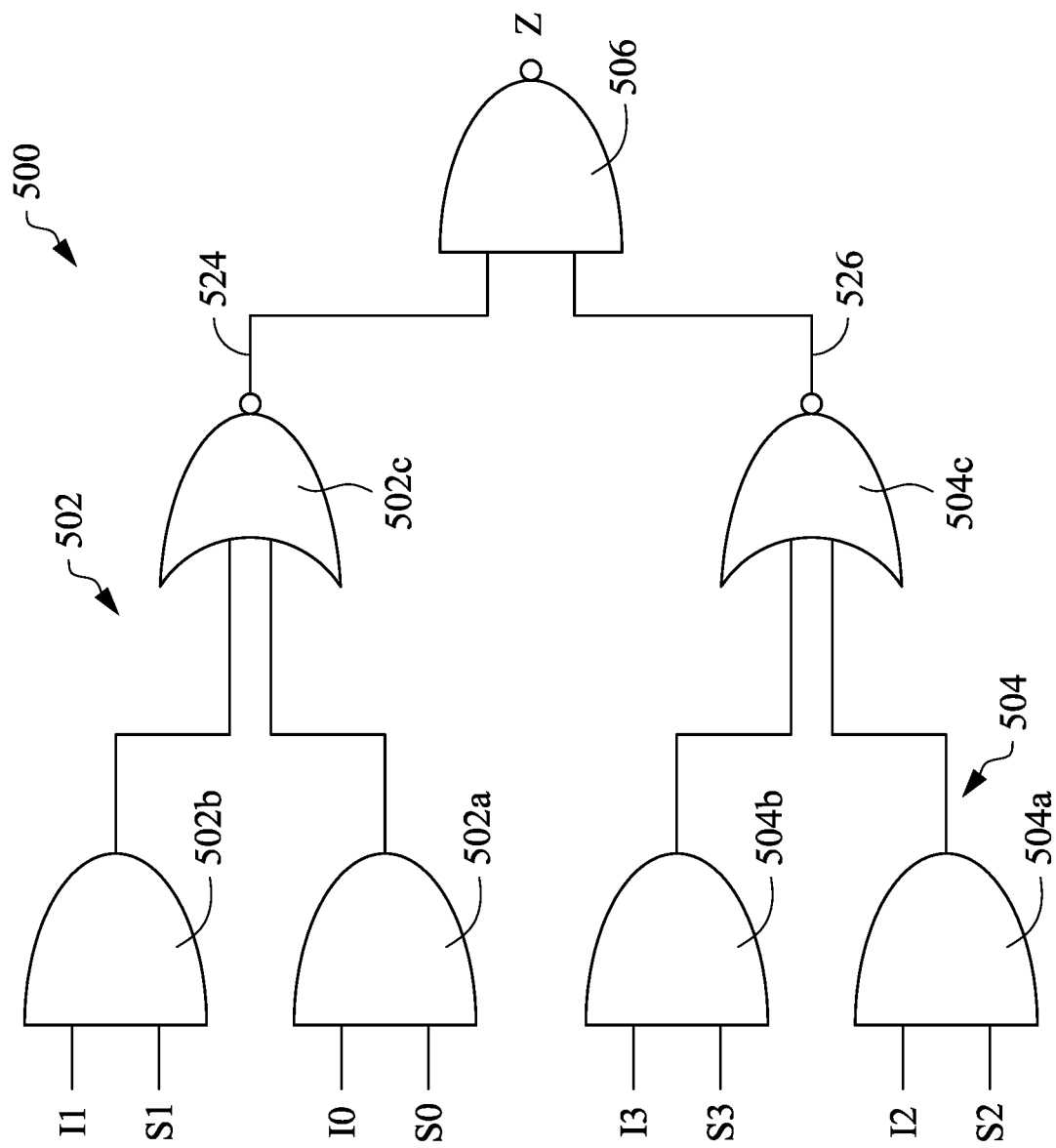
FIG. 13A is a logic diagram and FIG. 13B is a circuit diagram illustrating another example DMUX in accordance with some embodiments.
Figure 13B:
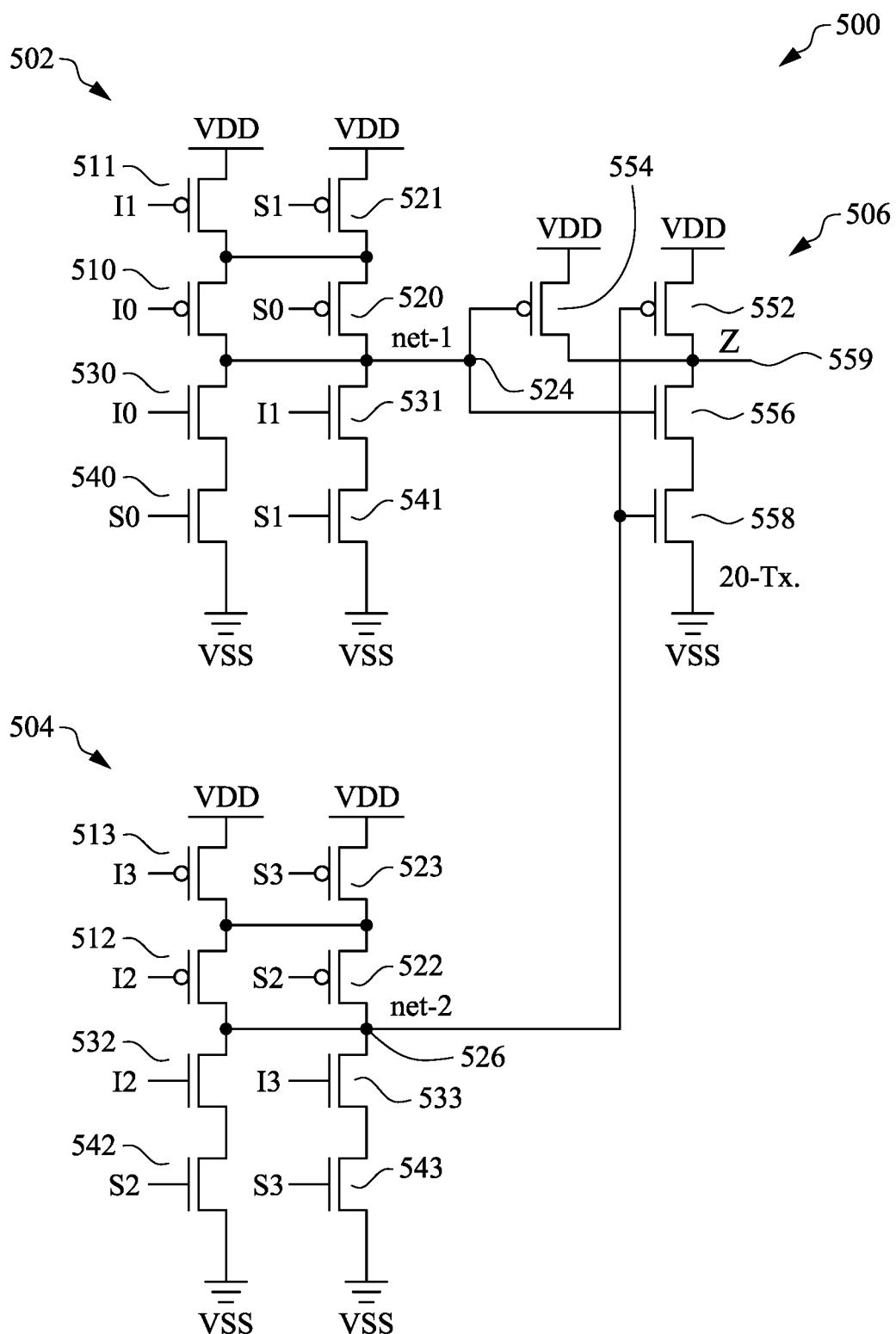

FIGS. 13A and 13B illustrate a further example DMUX4 circuit 500 that includes 20 transistors forming AOI22 logic circuits and an ND2 circuit. An input logic circuit has first and second AOI22 circuits 502 and 504. The first AOI22 circuit 502 includes AND gates 502a and 502b configured to respectively receive the I0 and I1 data signals and to respectively receive the S0 and S1 select signals. A NOR gate 502c is configured to receive the outputs of the AND gates 502a and 502b, and to provide an output at a first intermediate node 524. The second AOI22 circuit 504 includes AND gates 504a and 504b configured to respectively receive the I2 and I3 data signals and to respectively receive the S2 and S3 select signals. A NOR gate 504c is configured to receive the outputs of the AND gates 504a and 504b, and to provide an output at a second intermediate node 526. An output logic circuit includes an ND2 circuit 506 that has inputs connected to the first and second intermediate nodes 524 and 526 and is configured to provide a selected one of the first, second, third and fourth data signals I0-I3.

More particularly, as shown in FIG. 13B the first AOI22 circuit 502 includes a PMOS transistor 510 that has a gate terminal coupled to receive the I0 data signal. A PMOS transistor 520 has a gate terminal coupled to receive the S0 select signal. The PMOS transistor 510 and the PMOS transistor 520 both have source terminals coupled to the VDD rail, and drain terminals connected to the first intermediate node 524. NMOS transistors 530 and 540 have gate terminals coupled to receive the I0 and S0 inputs, respectively. The NMOS transistor 530 has a drain terminal coupled to the first intermediate node 524 and a source terminal coupled to a drain terminal of the NMOS transistor 540. A source terminal of the NMOS transistor 540 is connected to the VSS power rail.

The first AOI22 circuit 502 includes a PMOS transistor 510 that has a gate terminal coupled to receive the I1 data signal. A PMOS transistor 521 has a gate terminal coupled to receive the S1 select signal. The PMOS transistor 511 and the PMOS transistor 521 both have source terminals coupled to the VDD rail, and drain terminals connected to the second intermediate node 526. NMOS transistors 531 and 541 have gate terminals coupled to receive the I1 and S1 inputs, respectively. The NMOS transistor 531 has a drain terminal coupled to the second intermediate node 526 and a source terminal coupled to a drain terminal of the NMOS transistor 541. A source terminal of the NMOS transistor 541 is connected to the VSS power rail.

The second AOI22 circuit 504 includes a PMOS transistor 512 that has a gate terminal coupled to receive the I2 data signal. A PMOS transistor 522 has a gate terminal coupled to receive the S2 select signal. The PMOS transistor 512 and the PMOS transistor 522 both have source terminals coupled to the VDD rail, and drain terminals connected to the third intermediate node 528. NMOS transistors 532 and 542 have gate terminals coupled to receive the I2 and S2 inputs, respectively. The NMOS transistor 532 has a drain terminal coupled to the third intermediate node 528 and a source terminal coupled to a drain terminal of the NMOS transistor 542. A source terminal of the NMOS transistor 542 is connected to the VSS power rail.

The second AOI22 circuit 504 includes a PMOS transistor 513 that has a gate terminal coupled to receive the I3 data signal. A PMOS transistor 523 has a gate terminal coupled to receive the S3 select signal. The PMOS transistor 513 and the PMOS transistor 523 both have source terminals coupled to the VDD rail, and drain terminals connected to the fourth intermediate node 529. NMOS transistors 533 and 543 have gate terminals coupled to receive the I3 and S3 inputs, respectively. The NMOS transistor 533 has a drain terminal coupled to the fourth intermediate node 529 and a source terminal coupled to a drain terminal of the NMOS transistor 543. A source terminal of the NMOS transistor 543 is connected to the VSS power rail.

The ND2 circuit 506 includes a PMOS transistor 554 that has a gate terminal coupled to the first intermediate node 524, a PMOS transistor 552 with a gate terminal coupled to the second intermediate node 526. The PMOS transistors 554 and 552 each have a source terminal coupled to the VDD rail, and a drain terminal connected to the output terminal 559 that provides the output signal Z. NMOS transistors 556 and 558 have gate terminals coupled to the first and second intermediate nodes 524 and 526, respectively. The NMOS transistor 556 has a drain terminal coupled to the output terminal 559 and a source terminal coupled to a drain terminal of the NMOS transistor 558. A source terminal of the NMOS transistor 556 is coupled to a drain terminal of the NMOS transistor 558, which has a source terminal connected to the VSS power rail.

FIGS. 14-17 are layout diagrams illustrating various example standard cell layouts 500a-500d for the DMUX4 circuit 500. The embodiments shown in FIGS. 14-16 each include first and second fins 560, 562 extending in the X-axis direction. The example illustrated in FIG. 17 includes four fins 560, 562, 563, 564. Metal lines 566, which may be in one or more metal layers, e.g. M1 extend between the VDD and VDD rails and the fins 560, 562, 563, 564 to connect the source or drain terminals of the transistors to the VDD or VSS rails as shown in FIG. 13. For transistors where source or drain terminals are not connected to the VDD or VSS terminals, the metal lines 566 may be cut or disconnected from the VDD or VSS rails. For instance, metal lines 566 connect the source terminals of the transistors 511, 513, 521, 523, 552 and 554 to the VDD rail(s), and the source terminals of the transistors 540, 541, 542, 543, and 558 to the VSS rail(s).

Gates, such as poly gates 570 extend in the Y-axis direction and are connected to corresponding data signals I0-I3 and select signals S0-S3. In the examples shown in FIGS. 14-16, active poly gates 570 form gates of the various transistors shown in the DMUX4 circuit 500. More specifically, the embodiments shown in FIGS. 14-16 include eight poly gates 570a-570h that are configured to connect to the data signals I0-I3 and the select signals S0-S3. Referring now to the layout 500a shown in FIG. 14, the poly gates 570a-570d each extend in the Y-axis direction and contact both fins 560, 562. Each of the poly gates 570a-570d connects to a corresponding input signal, i.e., poly gate 570a connects to the I0 data signal, poly gate 570b connects to the S0 select signal, poly gate 570c connects to the I1 data signal, and poly gate 570d connects to the S1 select signal.

On the right side of the layout 500a, the poly gates 570f and 570g are separated or cut by cut-poly patterns 571 between the first and second fins 560, 562 such that the poly gates 570f and 570g each include separated upper and lower segments that contact the first and second fins 560 and 562, respectively. Further, the I3 and S2 connections are split. For instance, rather than one continuous poly gate providing the I3 signal to both the PMOS transistor 513 and the NMOS transistor 533, and another continuous poly gate providing the S2 signal to both the PMOS transistor 512 and the NMOS transistor 542, the poly gate 570f is cut or separated by the cut poly 571. The upper segment of the poly gate 570f forms the gate of the PMOS transistor 513 and receives the I3 data signal shown adjacent the fin 560 in FIG. 14. Further, the lower segment of the poly gate 570f forms the gate of the NMOS transistor 542 and receives the S3 data signal shown adjacent the fin 560.

Further active poly gates 570i and 570j extend in the Y-axis direction and form the gates of the transistors of the ND2 circuit 506. The poly gate 570j is immediately adjacent the poly gate 570f. This arrangement places the sources of the PMOS transistor 513 (receiving the I3 data signal) of the second AOI22 circuit 504 and the PMOS transistor 552 of the ND2 circuit 506 immediately adjacent one another such that they abut. This allows the VDD connection to be "shared" by the sources of the PMOS transistor 513 and the PMOS transistor 552. By receiving the S2 select signal on the same poly gate 570f for the NMOS transistor 542, the source of the NMOS transistor 542 abuts the source of the NMOS transistor 558, allowing them to "share" the VSS connection thereto. This reduces area of the circuit and reduces one poly pitch. A dummy gate 572 is situated between the poly gate 570j and the poly gate 570b.

Figure 14:
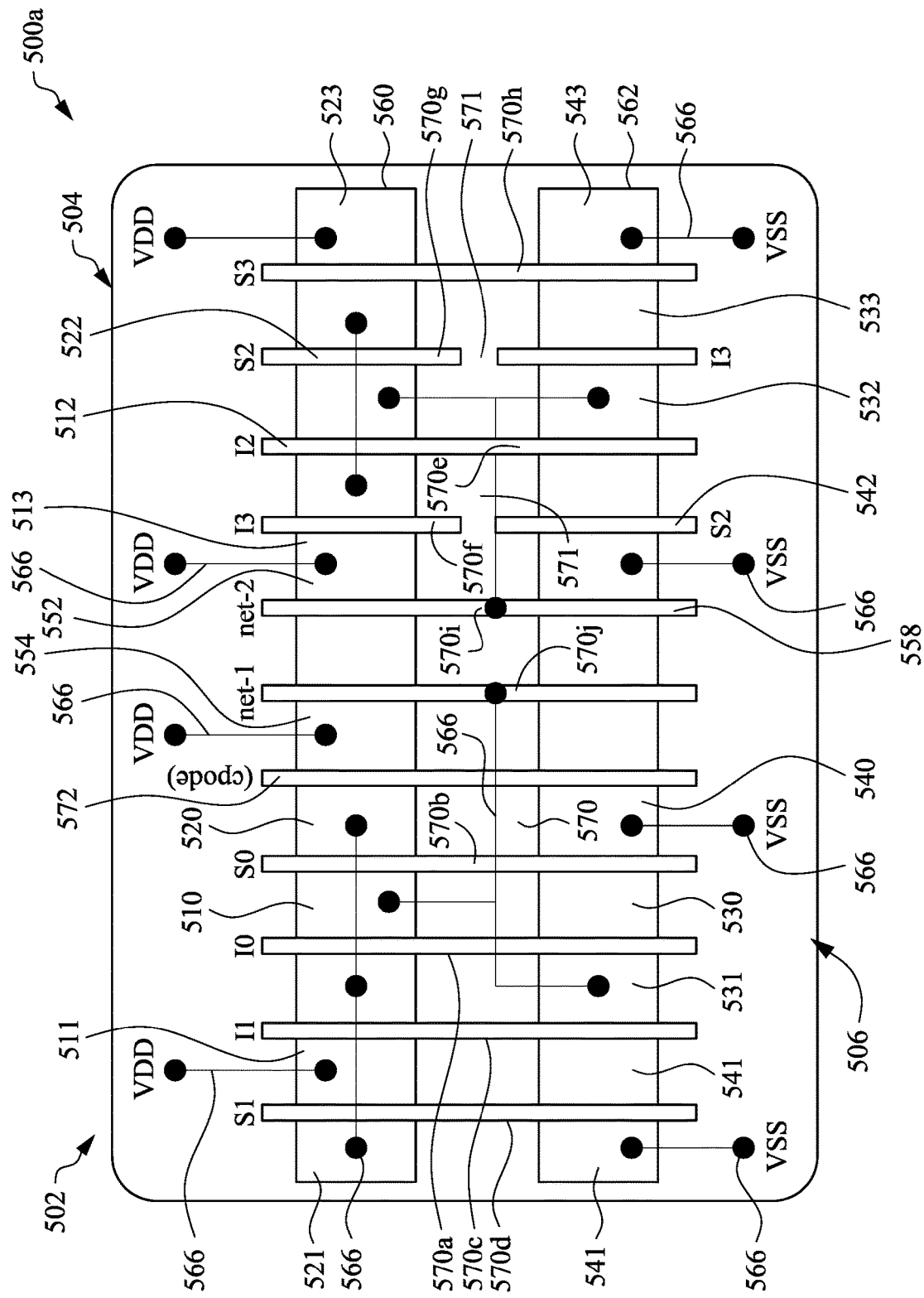
FIGS. 14-17 are layout diagrams illustrating an example standard cell layouts for the DMUX shown in FIG. 13 in accordance with some embodiments.
Figure 15:
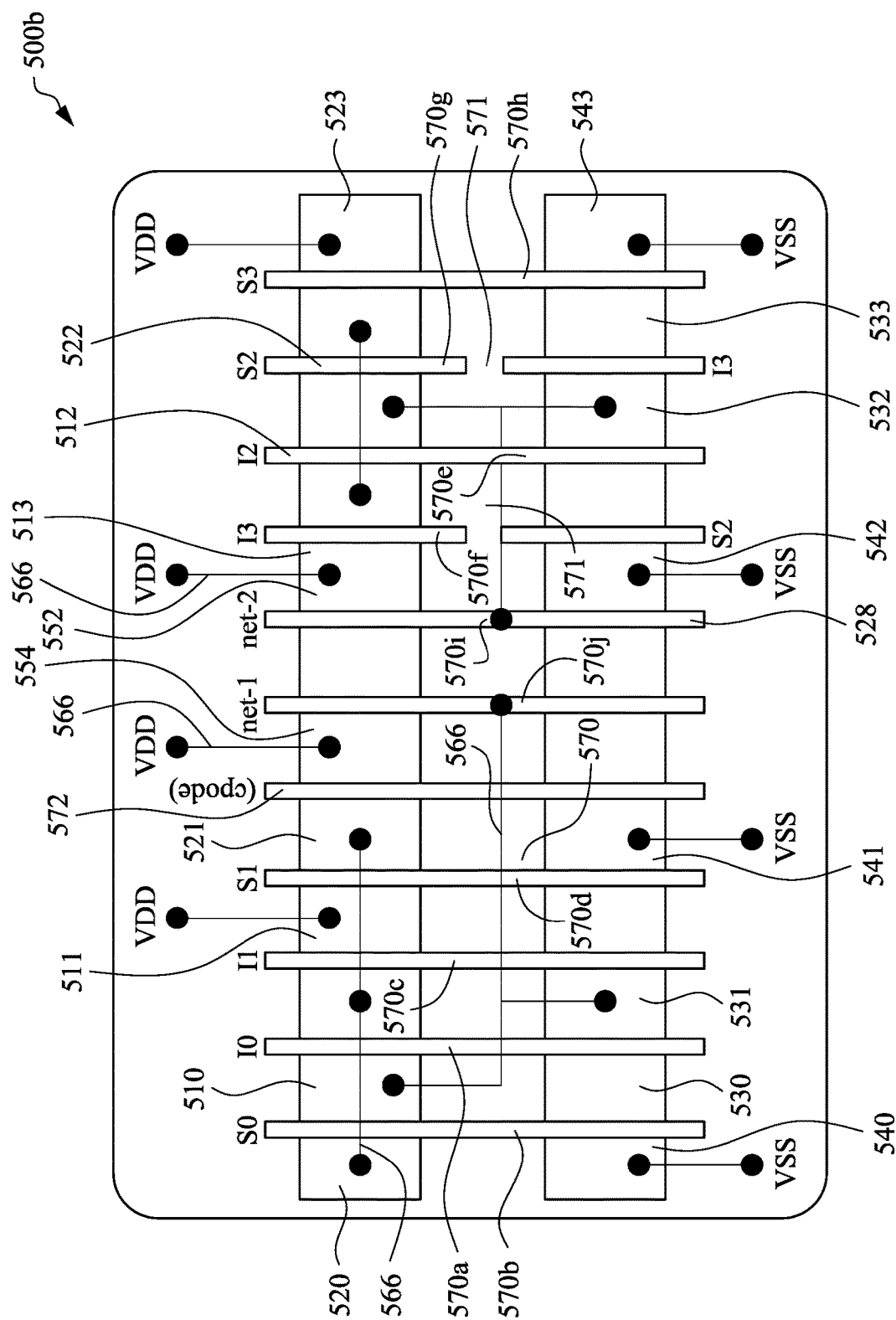

The example layout 500b for the DMUX5 500 shown in FIG. 15 is similar to the layout 500a shown in FIG. 14, with the cut poly gates arranged such that the VDD connection is shared by the sources of the PMOS transistor 513 and the PMOS transistor 552, and the VSS connection is shared by the sources of the NMOS transistor 542 and the NMOS transistor 558. In FIG. 15, the positions of the first data and select signals I0, S0 are swapped with the positions of the second data and select signals I1, S1 from that shown in FIG. 14. The abutting arrangement of the sources of the PMOS transistor 513 and the PMOS transistor 552, and the NMOS transistor 558 and the NMOS transistor 542 reduces area of the circuit and reduces one poly pitch, since the poly gate 570f is immediately adjacent the poly gate 570i. In other words, there is no dummy gate between the poly gate 570f and poly gate 570i.

Figure 16:
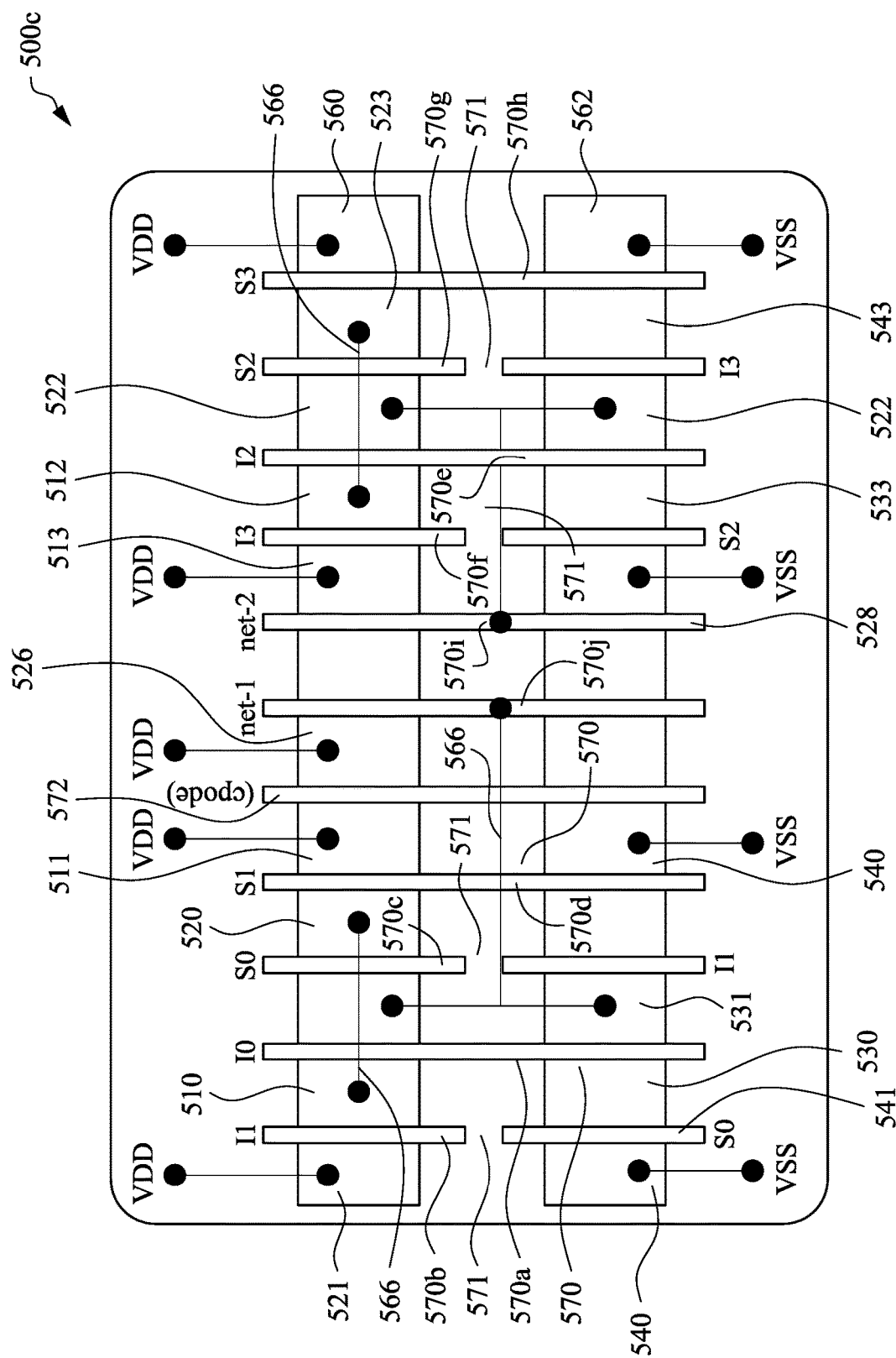

In FIG. 16, cut polys 571 are additionally provided for the poly gates 570b and 570c such that these poly gates include upper and lower segments contacting the first and second fins 560 and 562, respectively. The select signal S0 and the data signal I1 are swapped, such that the poly gate 570b receives the I1 input for the PMOS transistor 521 at its upper segment, and receives the S0 select signal for the NMOS transistor 540 at the lower segment of the poly gate 570b. The poly gate 570c receives the S0 select signal for the PMOS transistor 520 at its upper portion, and the I1 data signal for the NMOS transistor 531 at its lower portion.

Figure 17:
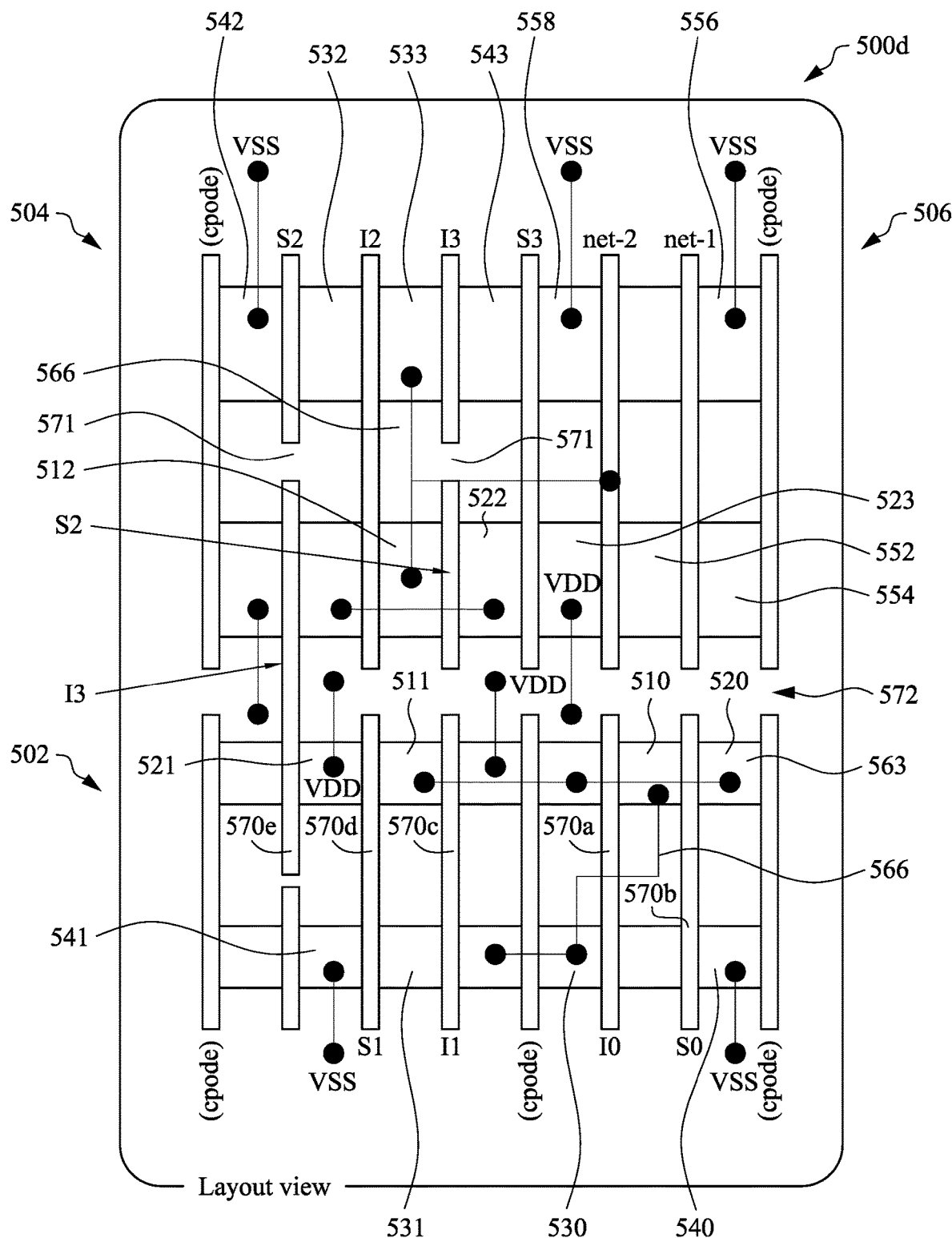

FIG. 17 illustrates an embodiment having four fins 560, 562, 563, 564. Poly gate 570a-570d are connected to receive the I0, S0, I1, S1 signals for the PMOS transistors 510, 520, 511, 521 formed with the fin 563, and the NMOS transistors 530, 540, 531, 541 formed with the fin 564. Cut polys 571 are included in the upper portion of the poly gates 570c, 570e, and the data signal I3 and the select signal S2 are swapped.

Figure 18:
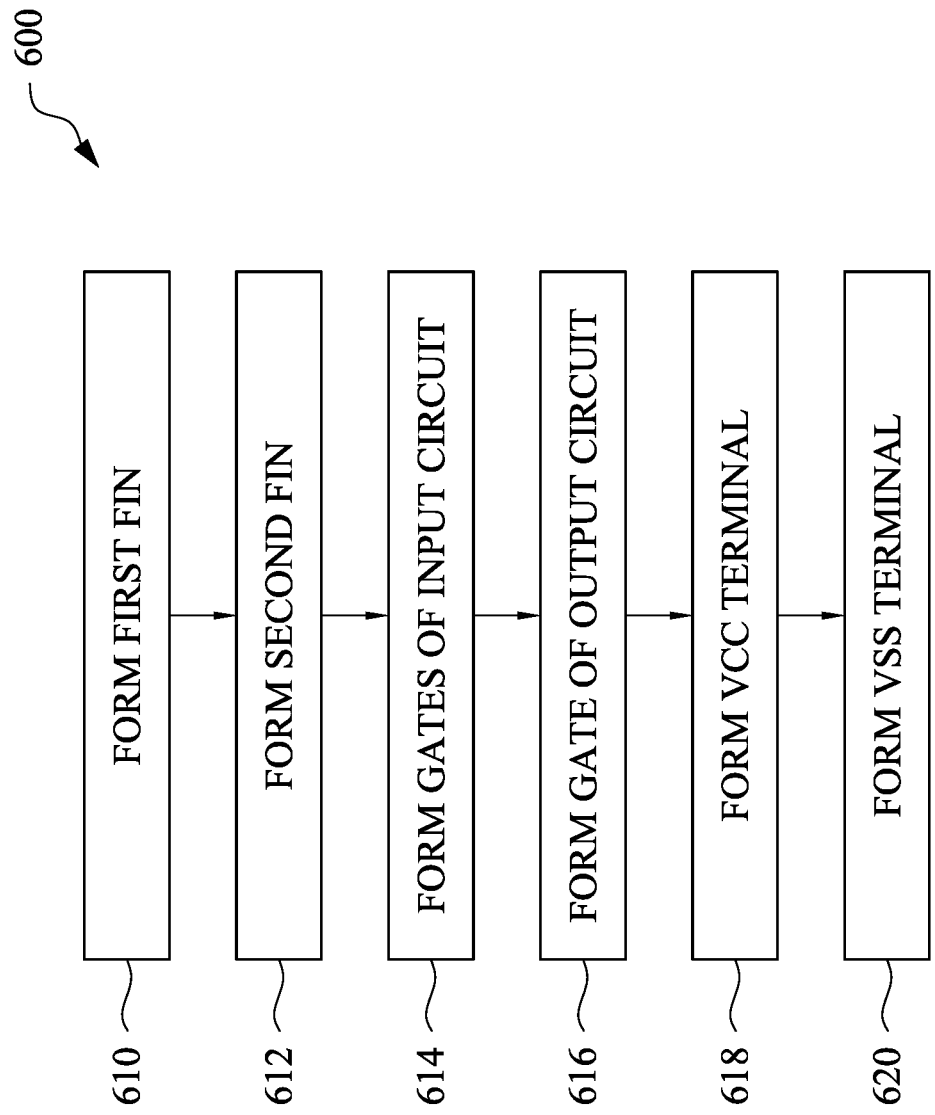
FIG. 18 is a flow diagram illustrating an example of a method in accordance with some embodiments.

FIG. 18 is a flow diagram illustrating a method 600 for producing a DMUX4, such as the various embodiments disclosed herein. Referring to FIG. 18 along with the example layout diagram of FIG. 14, at step 610 a first fin 560 is formed on a substrate to extend in an X-axis direction. At step 612, a second fin 562 is formed on the substrate to extend in the X-axis direction. A plurality of gates, such as the poly gates 570 are formed at step 614 to extend in the Y-axis direction and contact the first and second fins to form a plurality of PMOS transistors and a plurality of NMOS transistors of a multiplexer input circuit. As discussed above, the input circuit is configured to receive data and select input signals. A further poly gate is formed at step 616 to extend in the Y-axis direction and contact the first and second fins to form a first PMOS transistor and a first NMOS transistor of a multiplexer output circuit configured to output an output signal based on the received input and select input signals. The poly gate 570i is positioned immediately adjacent the poly gate 570f. At step 618 a VDD terminal is formed to connected to the first fin at a first location defining a source of a first PMOS transistor of the multiplexer input circuit and defining a source of the first PMOS transistor of the multiplexer output circuit. At step 620, a VSS terminal is formed to connect to the second fin at a second location defining a source of a first NMOS transistor of the multiplexer input circuit and a source of the first NMOS transistor of the multiplexer output circuit.

As noted above, this arrangement places the sources of the PMOS transistor 513 shown in FIG. 14 (receiving the I3 data signal) and the PMOS transistor 552 of the output ND2 circuit 506 immediately adjacent one another such that they abut. This allows the VDD connection to be "shared" by the sources of the PMOS transistor 513 and the PMOS transistor 552. Further, the source of the NMOS transistor 542 abuts the source of the NMOS transistor 558, allowing them to "share" the VSS connection thereto. This reduces area of the circuit and reduces one poly pitch. In some embodiments, a dummy gate is further situated between the poly gate 570j and the poly gate 570b.

The various DMUX4 circuits and standard cell layouts disclosed herein eliminate transmission gates and instead use various combination of logic cells, simplifying the design and sometimes reducing the total number of transistors used to implement the logic circuits. Disclosed standard cell layouts reduce cell area, eliminating one or more poly pitches in some instances.

In accordance with some disclosed examples, a multiplexer circuit has first and second fins each extending in an X-axis direction. First, second, third and fourth gates extend in a Y-axis direction perpendicular to the X-axis direction and contact the first and second fins. The first, second, third and fourth gates are configured to receive first, second, third and fourth data signals, respectively. Fifth, sixth, seventh and eighth gates extend in the Y-axis direction and contact the first and second fins. The fifth, sixth, seventh and eighth gates are configured to receive first, second, third and fourth select signals, respectively. An input logic circuit includes the first and second fins, and the first, second, third, fourth, fifth, sixth, seventh and eighth gates. The input logic circuit is configured to receive the first, second, third and fourth data signals and the first, second, third and fourth select signals, and to provide an output at an intermediate node. A ninth gate extends in the Y-axis direction and contacts the first and second fins. The ninth gate is connected to the intermediate node. An output logic circuit includes the first and second fins and the ninth gate and is configured to provide a selected one of the first, second, third and fourth data signals at an output terminal.

Further aspects of the disclosure relate to a multiplexer configured to receive first, second, third and fourth data signals and first, second, third and fourth select signals, and to output a selected one of the first, second, third and fourth data signals in response to the first, second, third and fourth select signals. The multiplexer includes first and second fins each extending in an X-axis direction. A first AOI22 circuit includes a first plurality of gates extending in a Y-axis direction perpendicular to the X-axis direction. A second AOI22 circuit includes a second plurality of gates extending in the Y-axis direction. An ND2 circuit includes a third plurality of gates extending in the Y-axis direction. The third plurality of gates are configured to receive first and second outputs from the first and second AOI22 circuits, respectively. A VDD terminal is connected to the first fin at a location defining a source of a PMOS transistor of the ND2 circuit and a source of a PMOS transistor of the second AOI22 circuit. A VSS terminal is connected to the second fin at a location defining a source of an NMOS transistor of the ND2 circuit and a source of an NMOS transistor of the second AOI22 circuit.

In accordance with other disclosed embodiments, a method includes forming a first fin on a substrate to extend in an X-axis direction. A second fin is formed on the substrate to extend in the X-axis direction. First, second, third, fourth, fifth, sixth, seventh and eighth gates are formed extending in a Y-axis direction perpendicular to the X-axis direction and contacting the first and second fins to form a plurality of PMOS transistors and a plurality of NMOS transistors of a multiplexer input circuit. A ninth gate is formed extending in the Y-axis direction and contacting the first and second fins to form a first PMOS transistor and a first NMOS transistor of a multiplexer output circuit. The ninth gate is positioned immediately adjacent the eighth gate. A VDD terminal is formed connected to the first fin at a first location defining a source of a first PMOS transistor of the multiplexer input circuit and defining a source of the first PMOS transistor of the multiplexer output circuit. A VSS terminal is formed connected to the second fin at a second location defining a source of a first NMOS transistor of the multiplexer input circuit and a source of the first NMOS transistor of the multiplexer output circuit.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A multiplexer circuit, comprising:
    first and second fins each extending in an X-axis direction;
    first, second, third and fourth gates extending in a Y-axis direction perpendicular to the X-axis direction and contacting the first and second fins, the first, second, third and fourth gates configured to receive first, second, third and fourth data signals, respectively;
    fifth, sixth, seventh and eighth gates extending in the Y-axis direction and contacting the first and second fins, the fifth, sixth, seventh and eighth gates configured to receive first, second, third and fourth select signals, respectively;
    an input logic circuit including the first and second fins, and the first, second, third, fourth, fifth, sixth, seventh and eighth gates, the input logic circuit configured to receive the first, second, third and fourth data signals and the first, second, third and fourth select signals, and to provide an output at an intermediate node;
    a ninth gate extending in the Y-axis direction and contacting the first and second fins, the ninth gate connected to the intermediate node; and
    an output logic circuit including the first and second fins and the ninth gate, the output logic circuit configured to provide a selected one of the first, second, third and fourth data signals at an output terminal.

2. The multiplexer circuit of claim 1, further comprising first and second power rails;
    wherein the input logic circuit comprises an eight-input AND-OR (AO2222) circuit that includes:
        first, second, third and fourth PMOS transistors having the first, second, third and fourth gates configured to receive the first, second, third and fourth data signals, respectively;
        fifth, sixth, seventh and eighth PMOS transistors having the fifth, sixth, seventh and eighth gates configured to receive the first, second, third and fourth select signals, respectively;
        the first and fifth PMOS transistors each having drain terminals connected to the intermediate node and source terminals connected to one another, the second and sixth PMOS transistors each having drain terminals connected to the source terminals of the first and fifth PMOS transistors and source terminals connected to one another, the third and seventh PMOS transistors each having drain terminals connected to the source terminals of the second and sixth PMOS transistors and source terminals connected to one another, the fourth and eighth PMOS transistors each having drain terminals connected to the source terminals of the third and seventh PMOS transistors source terminals connected to the first power rail;

first, second, third and fourth NMOS transistors having first, second, third and fourth gates configured to receive the first, second, third and fourth data signals, respectively;

fifth, sixth, seventh and eighth NMOS transistors having the fifth, sixth, seventh and eighth gates configured to receive the first, second, third and fourth select signals, respectively;

the first, second, third and fourth NMOS transistors each having drain terminals connected to the intermediate node, the fifth, sixth, seventh and eighth NMOS transistors each having source terminals connected to the second power rail, and the first, second, third and fourth NMOS transistors having source terminals connected to respective drain terminals of the fifth, sixth, seventh and eighth NMOS transistors.

3. The multiplexer circuit of claim 2, wherein the output logic circuit includes an inverter circuit comprising:
a ninth PMOS transistor having the ninth gate and a source terminal connected to the first power rail;
a ninth NMOS transistor having the ninth gate and a source terminal connected to the second power rail; and
wherein the output terminal is formed at a junction of a drain terminal of the ninth PMOS transistor and a drain terminal of the ninth NMOS transistor.

4. The multiplexer circuit of claim 1, wherein the input circuit comprises:
a first two-input NAND (ND2) circuit including the first gate configured to receive the first data signal, and the fifth gate configured to receive the first select signal, and to provide an output at the first intermediate node; and
a six-input AND-OR-INVERT (AOI222) circuit including the second, third, and fourth gates configured to receive the second, third and fourth data signals, respectively, and the sixth, seventh, and eighth gates configured to receive the second, third and fourth select signals, respectively, and to provide an output at a second intermediate node.

5. The multiplexer circuit of claim 4, further comprising:
a tenth gate extending in the Y-axis direction and contacting the first and second fins;
wherein the ninth gate is connected to the first intermediate node and the tenth gate is connected to the second intermediate node; and
wherein the output logic circuit includes a second ND2 circuit having inputs connected to the ninth and tenth gates, and is configured to provide a selected one of the first, second, third and fourth data signals at the output terminal.

6. The multiplexer circuit of claim 1, wherein the input circuit comprises:
a first two-input NAND (ND2) circuit including the first gate configured to receive the first data signal and the fifth gate configured to receive the first select signal, and to provide an output at the first intermediate node;
a second ND2 circuit including the second gate configured to receive the second data signal and the sixth gate configured to receive the second select signal, and to provide an output at a second intermediate node; and
a four-input AND-OR-INVERT (AOI22) circuit including the third and fourth gates configured to receive the third and fourth data signals and the seventh and eighth gates configured to receive the third and fourth select signals, and to provide an output at a third intermediate node.

7. The multiplexer circuit of claim 6, further comprising:
a tenth gate extending in the Y-axis direction and contacting the first and second fins; and
an eleventh gate extending in the Y-axis direction and contacting the first and second fins;
wherein the ninth gate is connected to the first intermediate node, the tenth gate is connected to the second intermediate node, and the eleventh gate is connected to the third intermediate node;
wherein the output logic circuit includes a three-input NAND (ND3) circuit having inputs connected to the ninth, tenth, and eleventh gates, and is configured to provide a selected one of the first, second, third and fourth data signals at the output terminal.

8. The multiplexer circuit of claim 1, wherein the input circuit comprises:
a first two-input NAND (ND2) circuit including the first gate configured to receive the first data signal and the fifth gate configured to receive the first select signal and provide an output at the first intermediate node;
a second ND2 circuit including the second gate configured to receive the second data signal and the sixth gate configured to receive the second select signal and provide an output at a second intermediate node;
a third ND2 circuit including the third gate configured to receive the third data signal and the seventh gate configured to receive the third select signal and provide an output at a third intermediate node; and
a fourth ND2 circuit including the fourth gate configured to receive the fourth data signal and the eighth gate configured to receive the fourth select signal and provide an output at a fourth intermediate node.

9. The multiplexer circuit of claim 8, further comprising:
a tenth gate extending in the Y-axis direction and contacting the first and second fins;
an eleventh gate extending in the Y-axis direction and contacting the first and second fins; and
a twelfth gate extending in the Y-axis direction and contacting the first and second fins;
wherein the ninth gate is connected to the first intermediate node, the tenth gate is connected to the second intermediate node, the eleventh gate is connected to the third intermediate node, and the twelfth gate is connected to the fourth intermediate node;
wherein the output logic circuit includes a four-input NAND (ND4) circuit having inputs connected to the ninth, tenth, eleventh and twelfth gates, and is configured to provide a selected one of the first, second, third and fourth data signals at the output terminal.

10. A multiplexer configured to receive first, second, third and fourth data signals and first, second, third and fourth select signals, and to output a selected one of the first, second, third and fourth data signals in response to the first, second, third and fourth select signals, the multiplexer comprising:
first and second fins each extending in an X-axis direction;
a first AOI22 circuit including a first plurality of gates extending in a Y-axis direction perpendicular to the X-axis direction;

a second AOI22 circuit including a second plurality of gates extending in the Y-axis direction;

an ND2 circuit including a third plurality of gates extending in the Y-axis direction, the third plurality of gates configured to receive first and second outputs from the first and second AOI22 circuits, respectively;

a VDD terminal connected to the first fin at a location defining a source of a PMOS transistor of the ND2 circuit and a source of a PMOS transistor of the second AOI22 circuit; and a VSS terminal connected to the second fin at a location defining a source of an NMOS transistor of the ND2 circuit and a source of an NMOS transistor of the second AOI22 circuit.

11. The multiplexer of claim 10, wherein the first plurality of gates contacts the first and second fins and comprises first, second, third and fourth gates configured to receive the first and second data signals and the first and second select signals.

12. The multiplexer of claim 11, wherein the second plurality of gates contacts the first and second fins and comprises fifth, sixth, seventh and eighth gates configured to receive the third and fourth data signals and the third and fourth select signals.

13. The multiplexer of claim 12, wherein the third plurality of gates comprises ninth and tenth gates contacting the first and second fins and configured to receive the first and second outputs, respectively.

14. The multiplexer of claim 13, wherein the fifth and sixth gates each include first and second segments separated from one another such that the first segment contacts the first fin and the second segment contacts the second fin, and wherein the first segment of the fifth gate is configured to receive the fourth data signal, the second segment of the fifth gate is configured to receive the third select signal, the first segment of the sixth gate is configured to receive the third select signal, and the second segment of the sixth gate is configured to receive the fourth data signal.

15. The multiplexer of claim 14, wherein:
the fifth gate and the tenth gate are immediately adjacent one another;
the first segment of the fifth gate forms a gate of the PMOS transistor of the second AOI22 circuit;
the tenth gate forms a gate of the PMOS transistor of the ND2 circuit;
the source of the of the PMOS transistor of the second AOI22 circuit abuts the source of the PMOS transistor of the ND2 circuit;
the VDD terminal is connected to the first fin between the first segment of the fifth gate and the tenth gate;
the second segment of the fifth gate forms a gate of the NMOS transistor of the second AOI22 circuit;
the tenth gate forms a gate of the NMOS transistor of the ND2 circuit;
the source of the of the NMOS transistor of the second AOI22 circuit abuts the source of the NMOS transistor of the ND2; and
the VSS terminal is connected to second fin between the second segment of the fifth gate and the tenth gate.

16. The multiplexer of claim 10, further comprising third and fourth fins each extending in the X-axis direction.

17. The multiplexer of claim 10, further comprising an inactive structure extending in the Y-axis direction and contacting the first and second fins, the inactive structure situated between the first plurality of gates and the third plurality of gates.

18. A method, comprising:
forming a first fin on a substrate to extend in an X-axis direction;
forming a second fin on the substrate to extend in the X-axis direction;
forming first, second, third, fourth, fifth, sixth, seventh and eighth gates extending in a Y-axis direction perpendicular to the X-axis direction and contacting the first and second fins to form a plurality of PMOS transistors and a plurality of NMOS transistors of a multiplexer input circuit;
forming a ninth gate extending in the Y-axis direction and contacting the first and second fins to form a first PMOS transistor and a first NMOS transistor of a multiplexer output circuit, wherein the ninth gate is positioned immediately adjacent the eighth gate;
forming a VDD terminal connected to the first fin at a first location defining a source of a first PMOS transistor of the multiplexer input circuit and defining a source of the first PMOS transistor of the multiplexer output circuit; and
forming a VSS terminal connected to the second fin at a second location defining a source of a first NMOS transistor of the multiplexer input circuit and a source of the first NMOS transistor of the multiplexer output circuit.

19. The method of claim 18, further comprising forming a tenth gate extending in the Y-axis direction and contacting the first and second fins to form a second PMOS transistor and a second NMOS transistor of the multiplexer output circuit, wherein the tenth gate is positioned immediately adjacent the ninth gate.

20. The method of claim 19, wherein the first gate is configured to receive a first multiplexer input signal, the method further comprising forming a dummy gate extending in the Y-axis direction and contacting the first and second fins between the first gate and the tenth gate.

* * * * *